(12) United States Patent
Nagashima

(10) Patent No.: US 12,672,286 B2
(45) Date of Patent: Jun. 30, 2026

(54) NAND FLASH MEMORY DEVICE WITH IMPROVED SHORT CIRCUIT PREVENTION

(71) Applicant: Kioxia Corporation, Tokyo (JP)

(72) Inventor: Satoshi Nagashima, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 393 days.

(21) Appl. No.: 18/330,661

(22) Filed: Jun. 7, 2023

(65) Prior Publication Data

US 2024/0040785 A1 Feb. 1, 2024

(30) Foreign Application Priority Data

Aug. 1, 2022 (JP) ................................. 2022-122636

(51) Int. Cl.
H10B 43/27 (2023.01)
(52) U.S. Cl.
CPC .................................... H10B 43/27 (2023.02)
(58) Field of Classification Search
CPC ........ H10B 53/00; H10B 53/10; H10B 53/20;
H10B 53/30; H10B 53/40; H10B 53/50;
H10B 41/00; H10B 41/10; H10B 41/20;
H10B 41/23; H10B 41/27; H10B 41/30;
H10B 41/35; H10B 41/40–44; H10B
41/46–50; H10B 41/60; H10B 41/70;
H10B 43/00; H10B 43/10; H10B 43/20;
H10B 43/23; H10B 43/27; H10B 43/30;
H10B 43/35; H10B 43/40; H10B 43/50;
H10B 51/00; H10B 51/10; H10B 51/20;
H10B 51/30; H10B 51/40; H10B 51/50
See application file for complete search history.

(56) References Cited

U.S. PATENT DOCUMENTS

| | | | |
|---|---|---|---|
| 9,780,034 B1 | 10/2017 | Tsutsumi et al. | |
| 9,978,766 B1 * | 5/2018 | Hosoda | H10B 41/35 |
| 11,049,808 B2 | 6/2021 | Nishimura | |
| 2016/0079185 A1 * | 3/2016 | Kato | H10B 43/27 |
| | | | 257/314 |
| 2019/0198523 A1 * | 6/2019 | Nakanishi | H10B 43/50 |
| 2021/0074711 A1 * | 3/2021 | Suzuki | G11C 16/0483 |
| 2021/0295941 A1 * | 9/2021 | Asami | G11C 29/42 |

FOREIGN PATENT DOCUMENTS

JP 2020145311 A 9/2020

* cited by examiner

*Primary Examiner* — William B Partridge
*Assistant Examiner* — Gustavo G Ramallo
(74) *Attorney, Agent, or Firm* — Maier & Maier, PLLC

(57) ABSTRACT

A memory device includes first and second conductive layers aligned in a first direction; a memory pillar including first and second portions serving as first and second memory cells in a region where the second conductive layer overlaps the first conductive layer in the first direction; a first insulating member arranged between the first and second conductive layers in a region where the second conductive layer does not overlap the first conductive layer in the first direction; and a second insulating member intersecting with the first conductive layer in a region where the second insulating member overlaps the first insulating member in the first direction. An upper end of the second insulating member is separated from a lower end of the first insulating member.

16 Claims, 26 Drawing Sheets

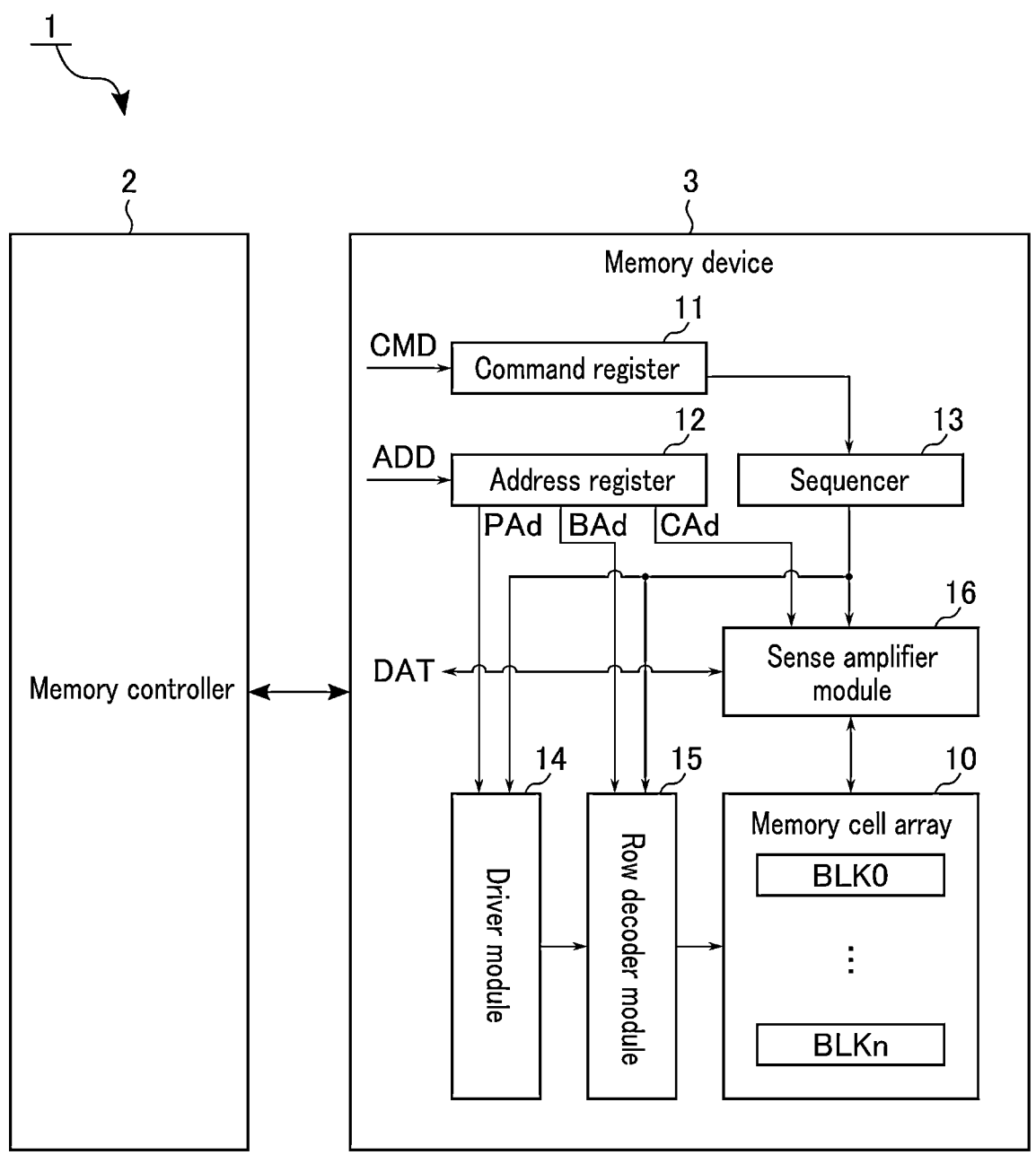
F I G. 1

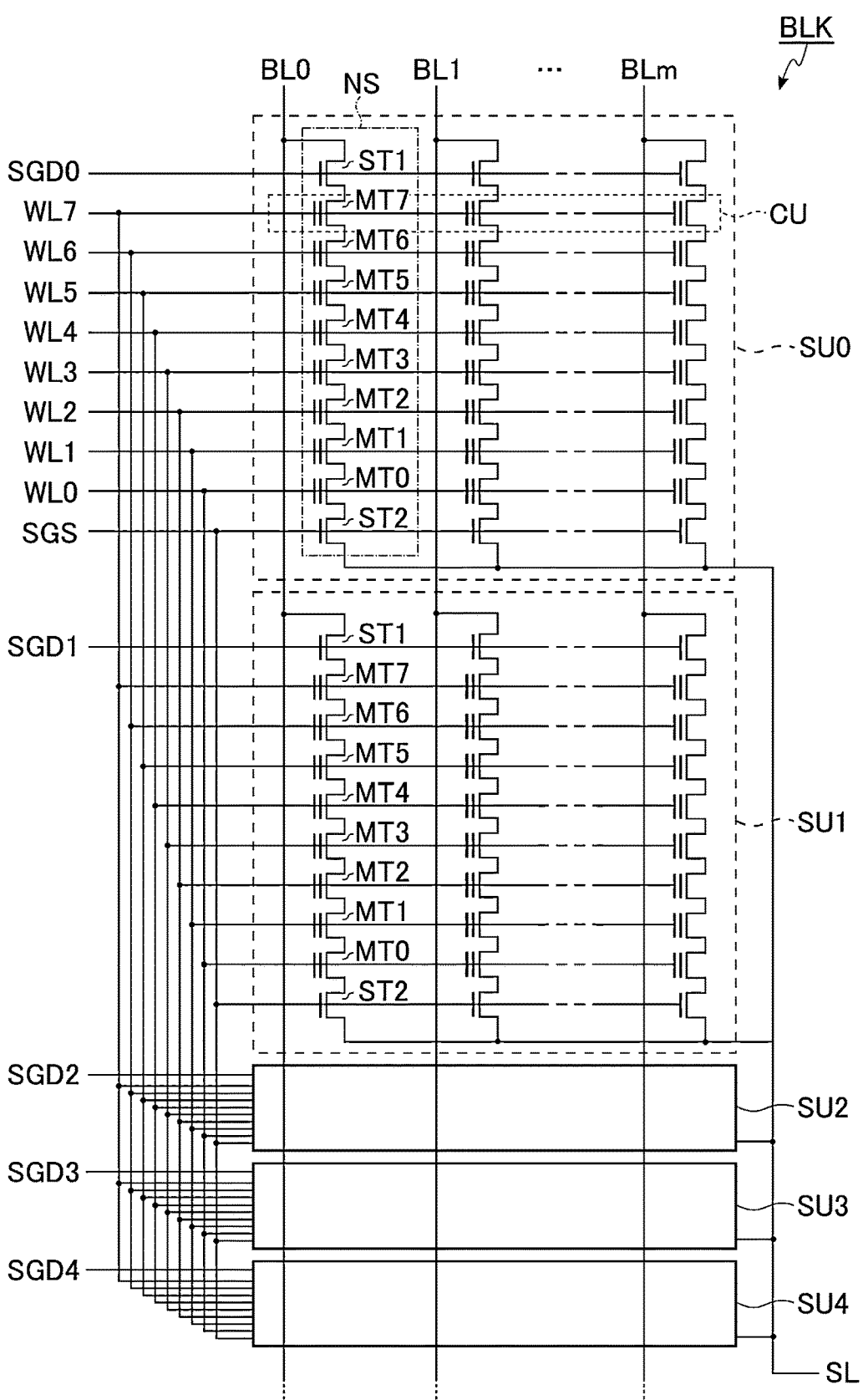
F I G. 2

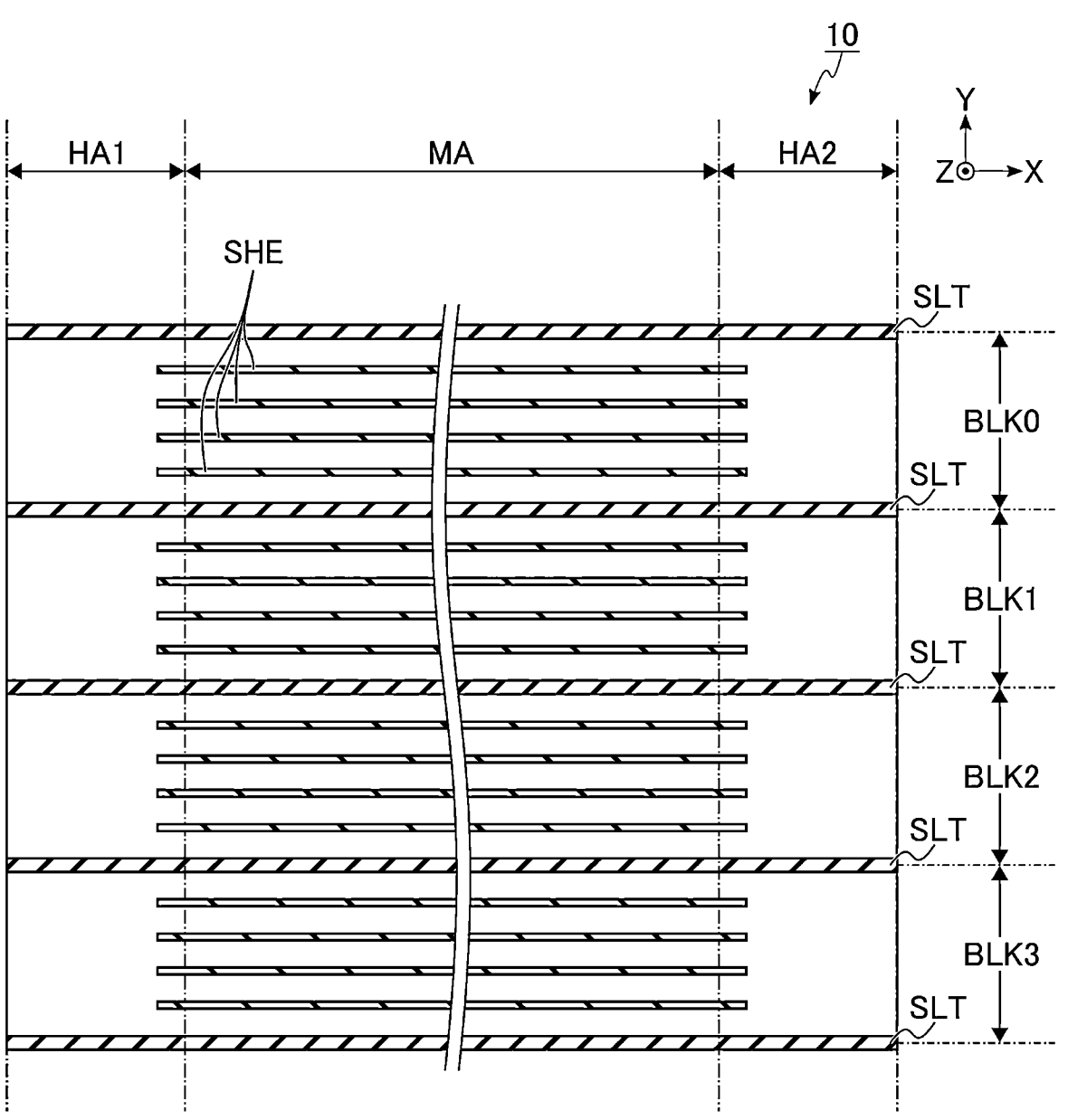
F I G. 3

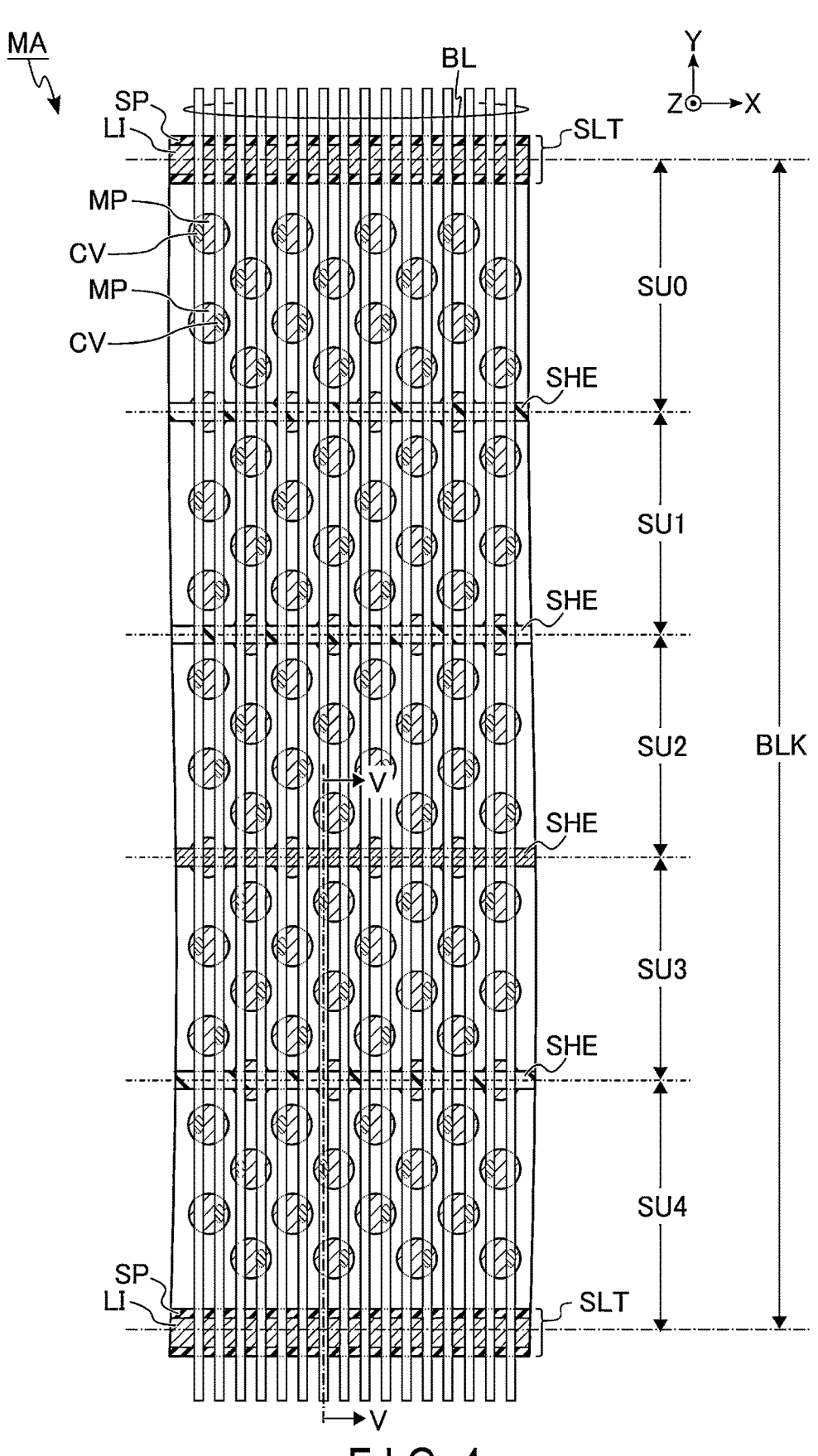
F I G. 4

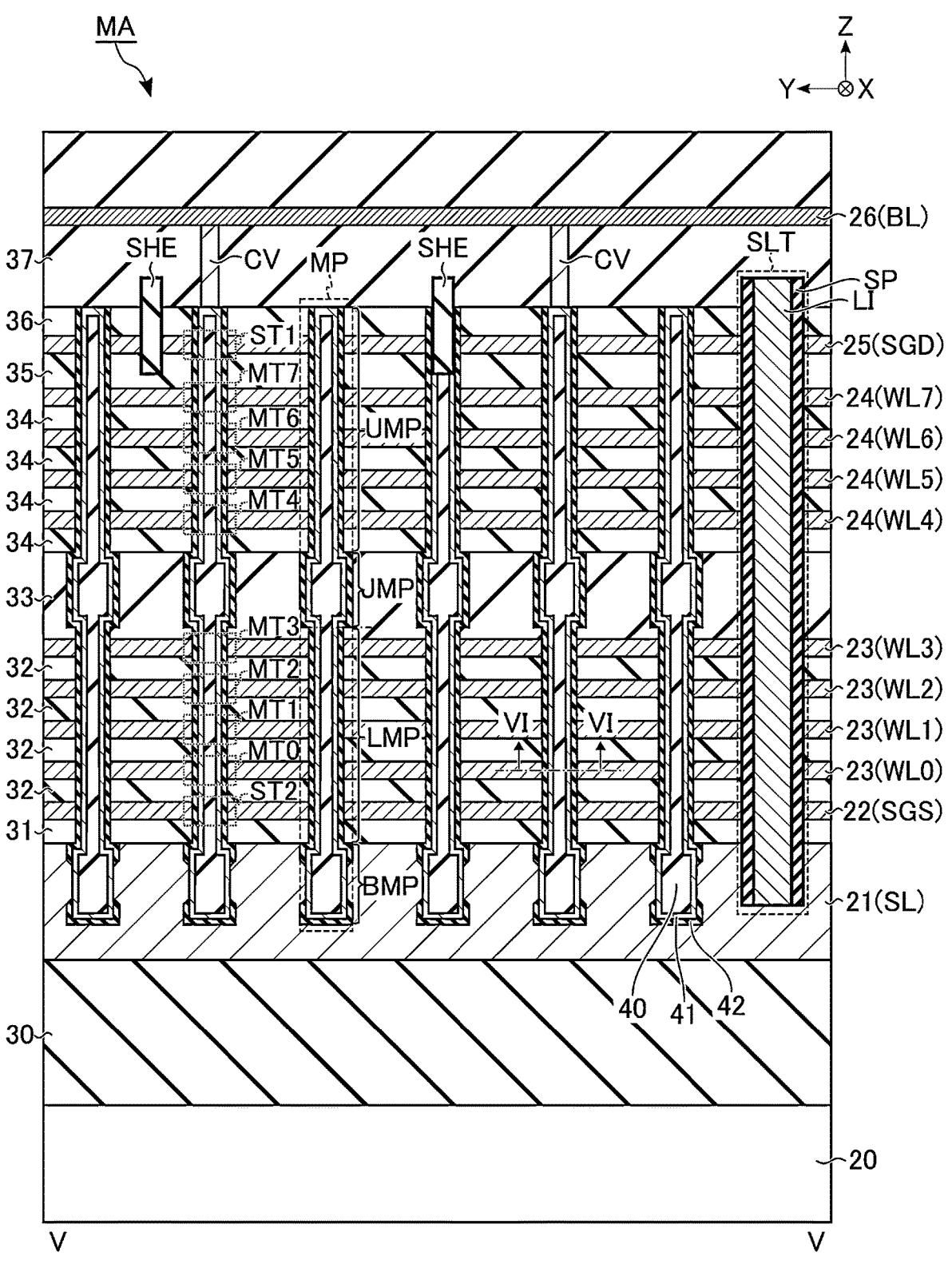
F I G. 5

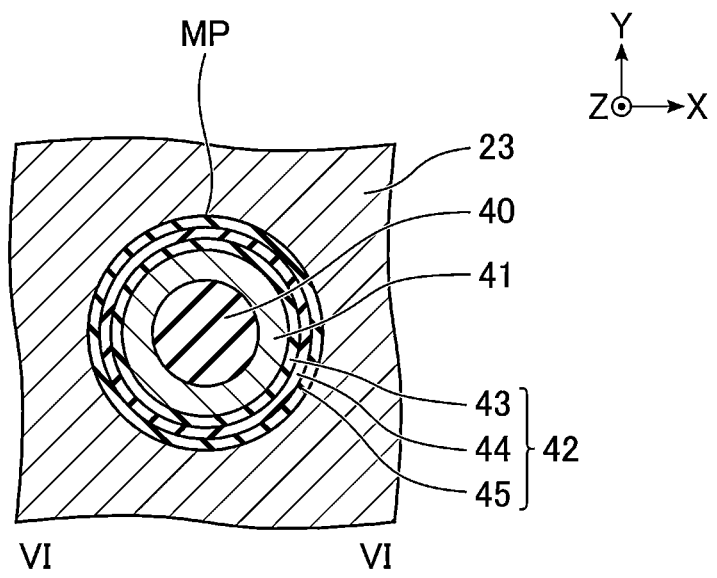
F I G. 6

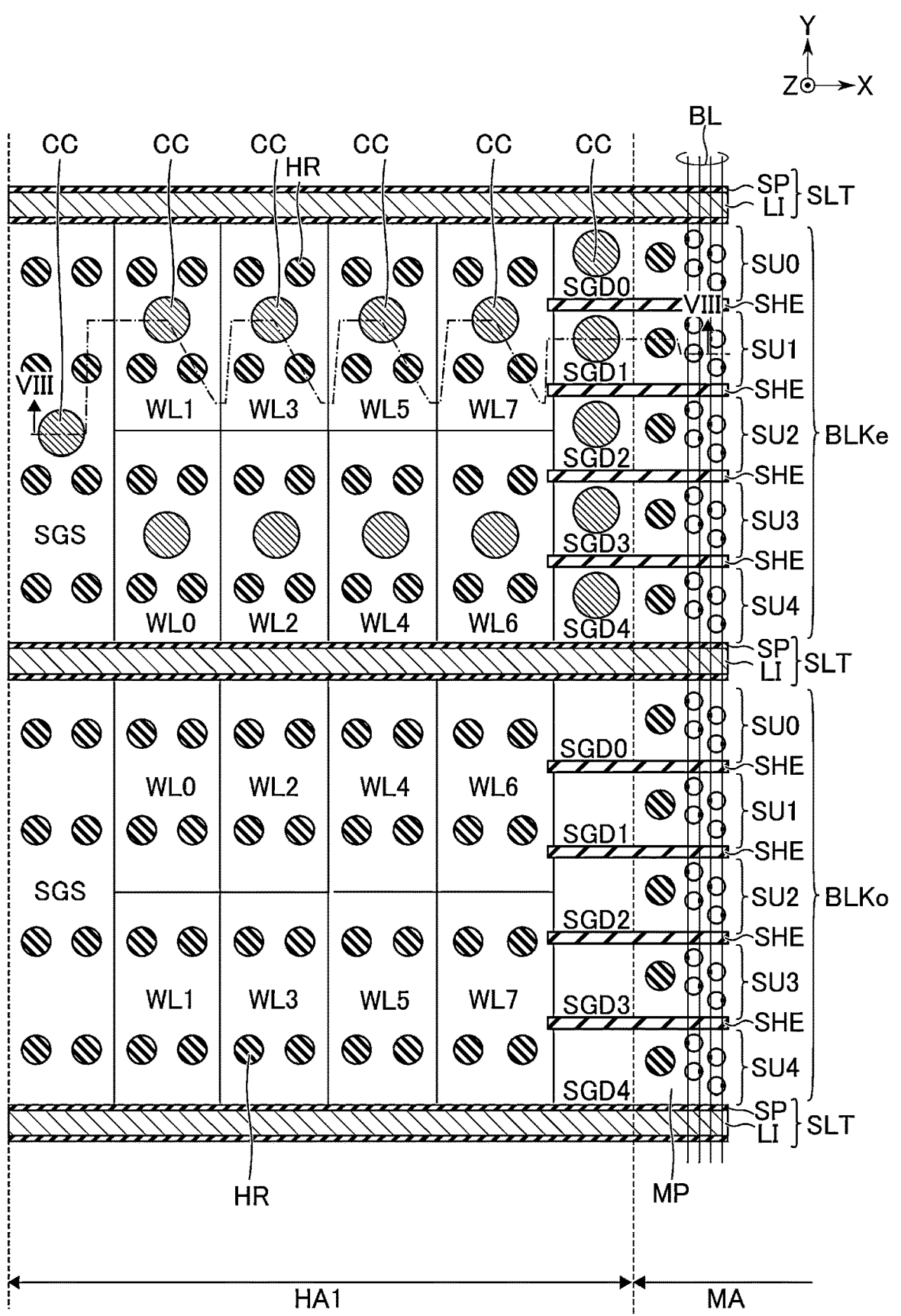
F I G. 7

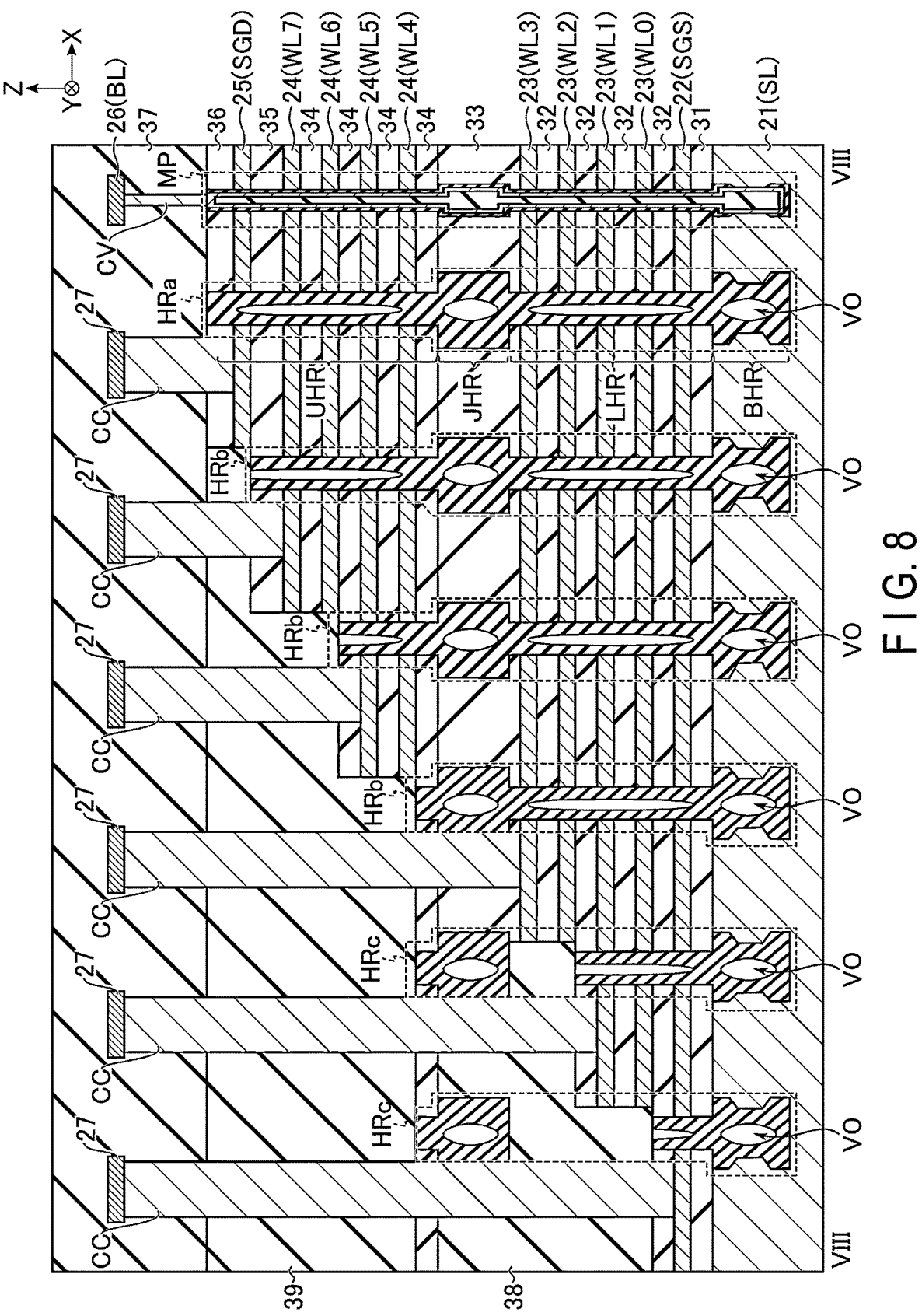
F I G. 8

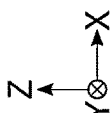
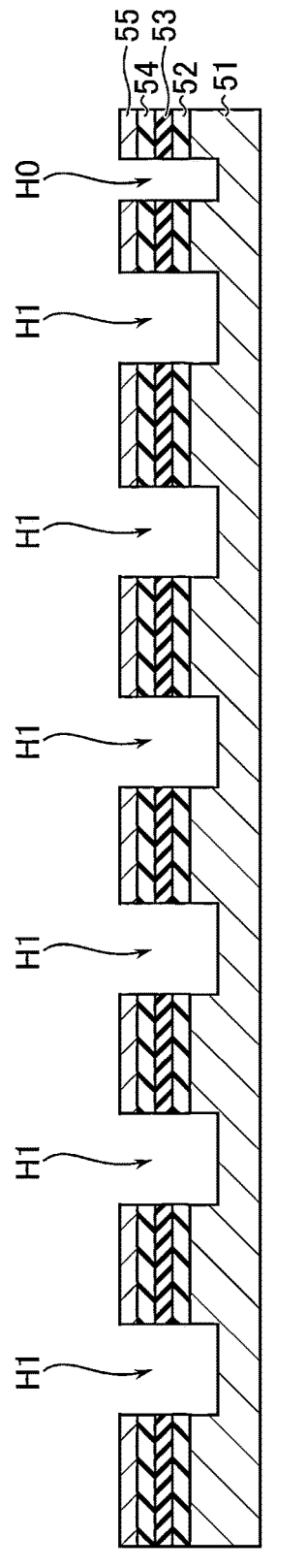
F I G. 9

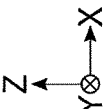
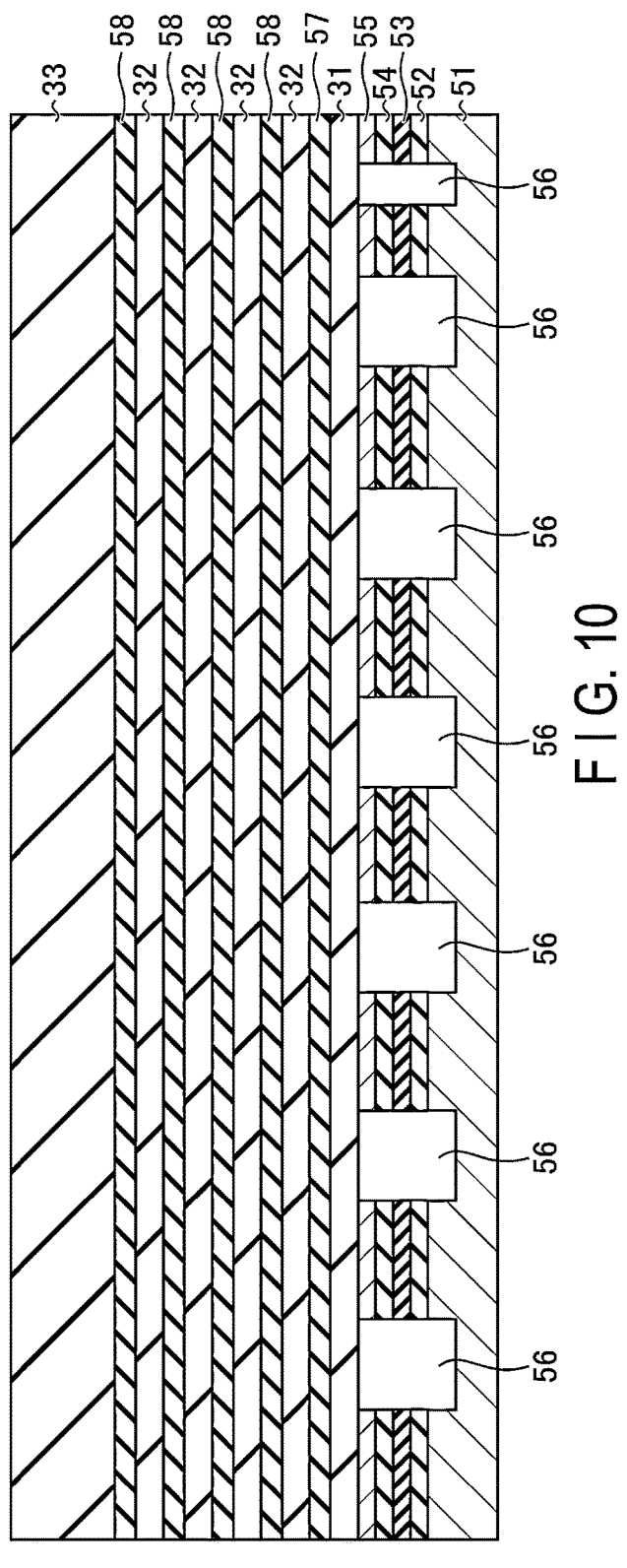
F I G. 10

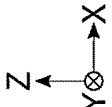
F I G. 12

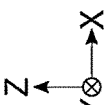
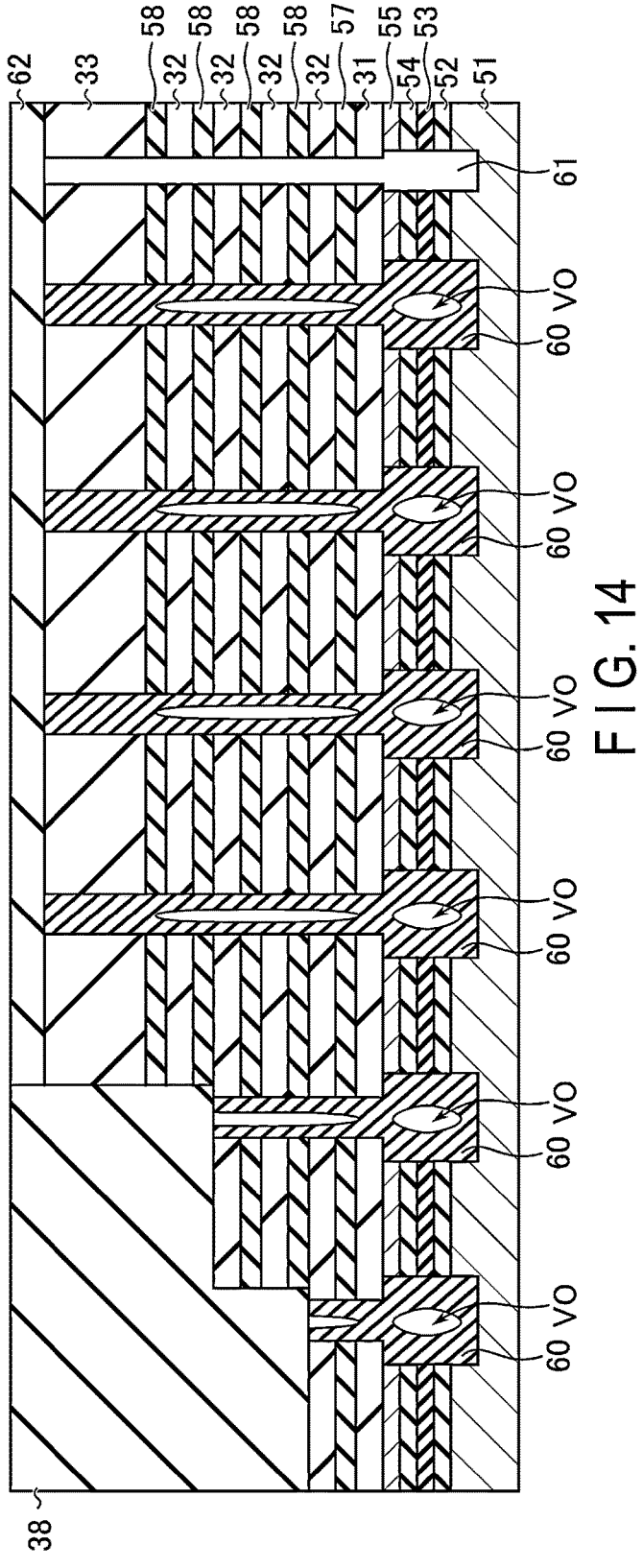
F I G. 14

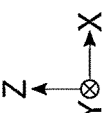
F I G. 15

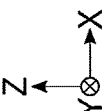
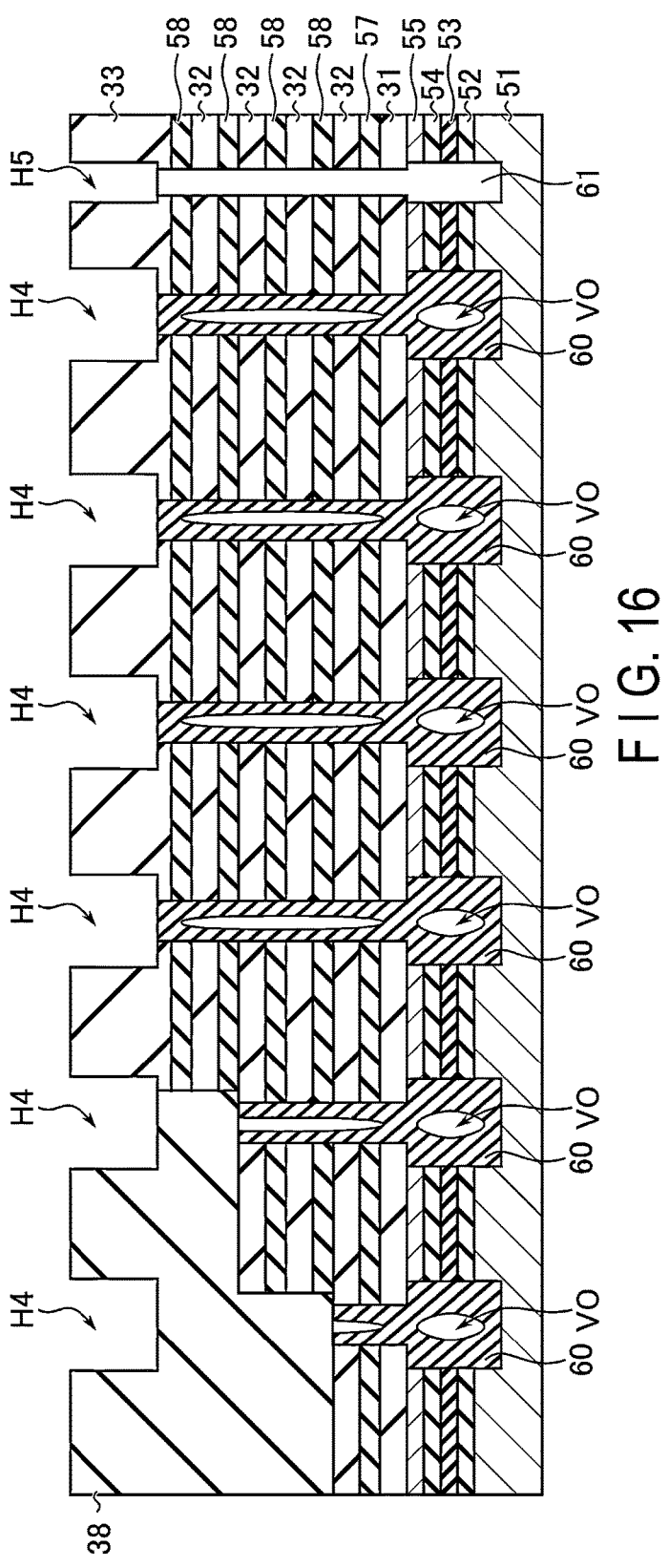
F I G. 16

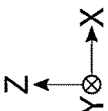
F I G. 17

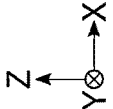
F I G. 18

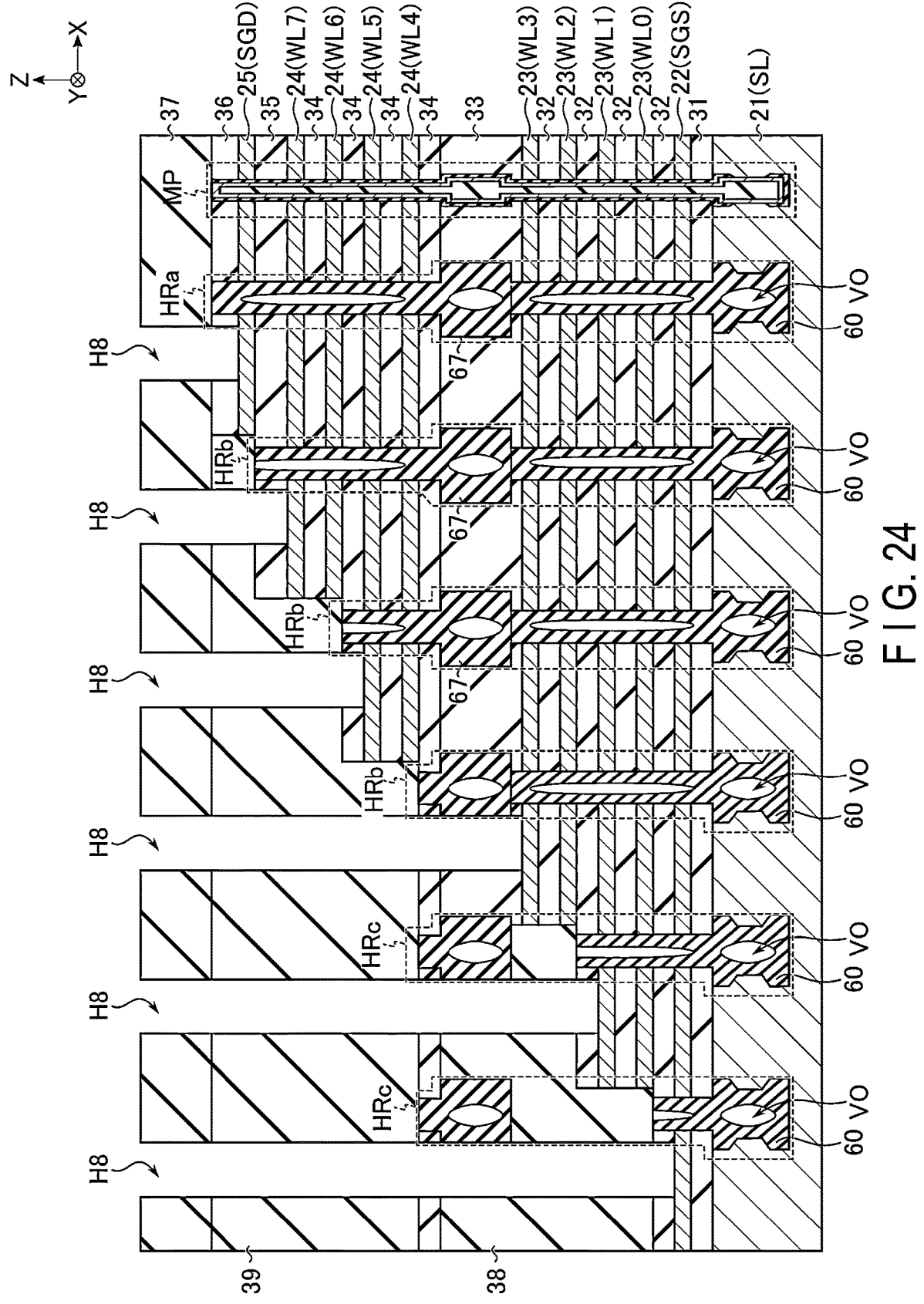
F I G. 24

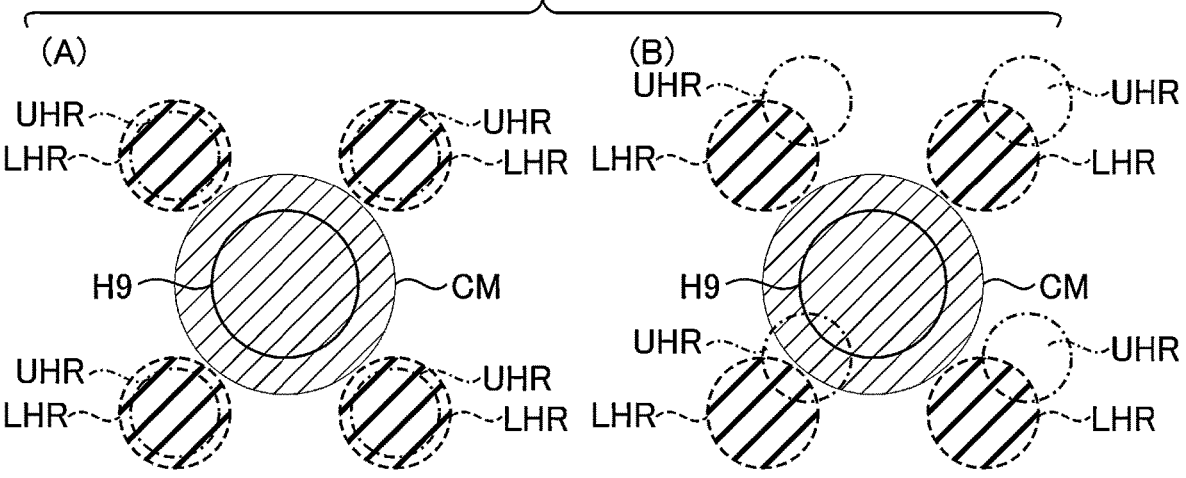
F I G. 25
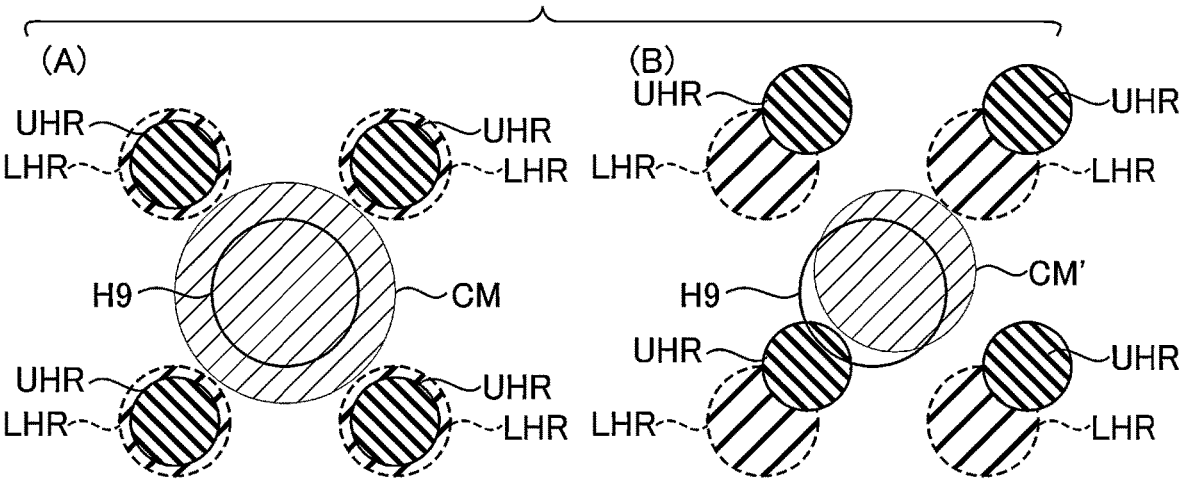
F I G. 26

NAND FLASH MEMORY DEVICE WITH IMPROVED SHORT CIRCUIT PREVENTION

CROSS-REFERENCE TO RELATED APPLICATIONS

This application is based upon and claims the benefit of priority from Japanese Patent Application No. 2022-122636, filed Aug. 1, 2022, the entire contents of which are incorporated herein by reference.

FIELD

Embodiments described herein relate generally to a memory device.

BACKGROUND

A NAND flash memory has been known as a memory device capable of storing data in a non-volatile manner. A memory device as represented by a NAND flash memory adopts a three-dimensional memory structure in order to enhance its integration and increase its capacity.

BRIEF DESCRIPTION OF THE DRAWINGS

FIG. 1 is a block diagram showing a configuration of a memory system that includes a memory device according to an embodiment.

FIG. 2 is a circuit diagram showing an exemplary circuit configuration of a memory cell array in the memory device according to the embodiment.

FIG. 3 is a plan view showing an exemplary planar layout of an area including the memory cell array in the memory device according to the embodiment.

FIG. 4 is a plan view showing an example of a detailed planar layout of a memory area in the memory device according to the embodiment.

FIG. 5 is a cross-sectional view taken along line V-V of FIG. 4, showing an exemplary cross-sectional structure of the memory area of the memory device according to the embodiment.

FIG. 6 is a cross-sectional view taken along line VI-VI of FIG. 5, showing an exemplary cross-sectional structure of a memory pillar in the memory device according to the embodiment.

FIG. 7 is a plan view showing a detailed exemplary planar layout of a hookup area of the memory device according to the embodiment.

FIG. 8 is a cross-sectional view taken along line VIII-VIII of FIG. 7, showing an exemplary cross-sectional structure of the hookup area of the memory device according to the embodiment.

FIG. 9 is a cross-sectional view showing an exemplary cross-sectional structure of the memory device at one step of the manufacturing process according to the embodiment.

FIG. 10 is a cross-sectional view showing an exemplary cross-sectional structure of the memory device at one step of the manufacturing process according to the embodiment.

FIG. 12 is a cross-sectional view showing an exemplary cross-sectional structure of the memory device at one step of the manufacturing process according to the embodiment.

FIG. 14 is a cross-sectional view showing an exemplary cross-sectional structure of the memory device at one step of the manufacturing process according to the embodiment.

FIG. 15 is a cross-sectional view showing an exemplary cross-sectional structure of the memory device at one step of the manufacturing process according to the embodiment.

FIG. 16 is a cross-sectional view showing an exemplary cross-sectional structure of the memory device at one step of the manufacturing process according to the embodiment.

FIG. 17 is a cross-sectional view showing an exemplary cross-sectional structure of the memory device at one step of the manufacturing process according to the embodiment.

FIG. 18 is a cross-sectional view showing an exemplary cross-sectional structure of the memory device at one step of the manufacturing process according to the embodiment.

FIG. 24 is a cross-sectional view showing an exemplary cross-sectional structure of the memory device at one step of the manufacturing process according to the embodiment.

FIG. 25 is a plan view showing an exemplary margin of a contact in a terrace portion of the memory device according to the embodiment.

FIG. 26 is a plan view showing an exemplary margin of a contact in a terrace portion of a memory device according to a comparative example.

DETAILED DESCRIPTION

Figure 11:
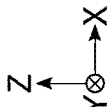
FIG. 11 is a cross-sectional view showing an exemplary cross-sectional structure of the memory device at one step of the manufacturing process according to the embodiment.
Figure 11:
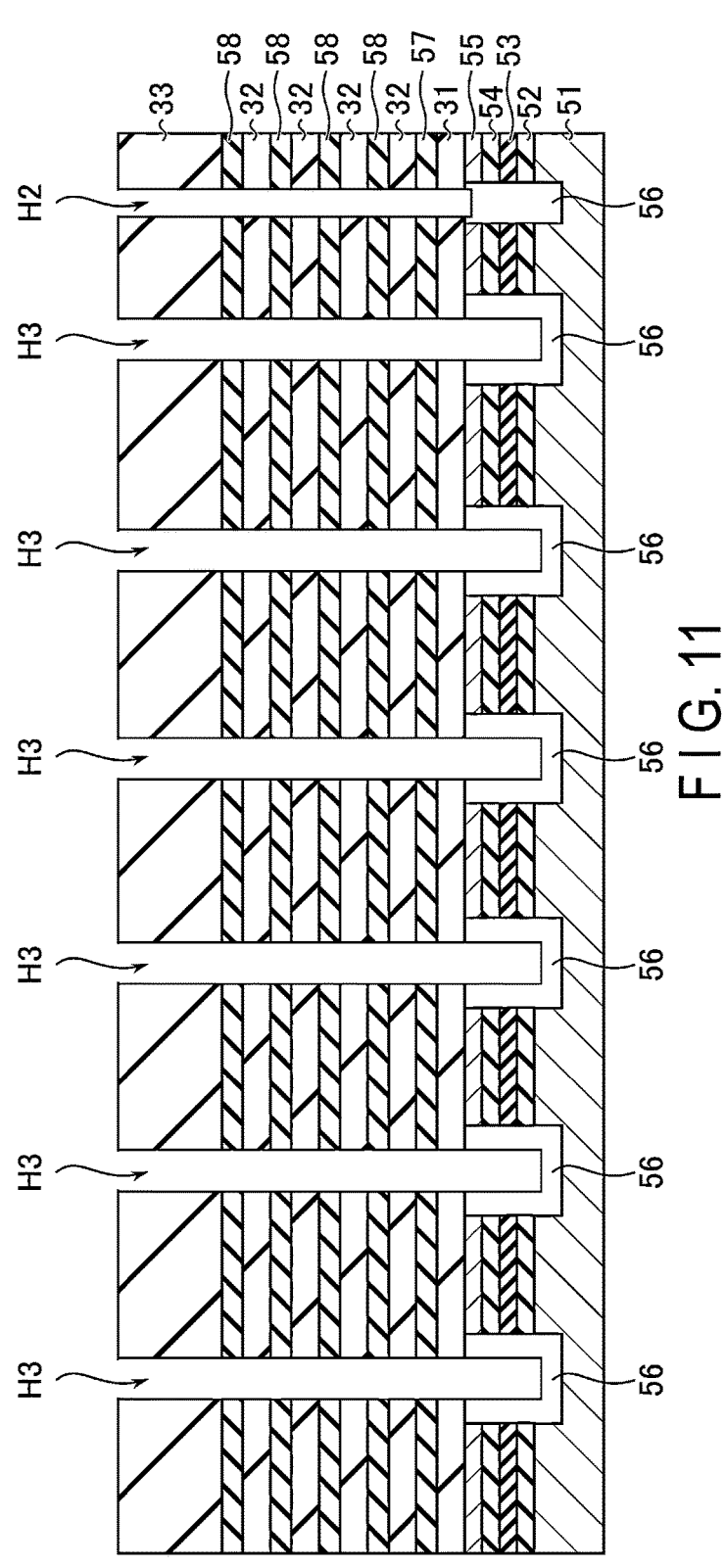

In general, according to one embodiment, a memory device includes: a first conductive layer and a second conductive layer arranged apart from each other and aligned in a first direction; a memory pillar including a first portion serving as a first memory cell and a second portion serving as a second memory cell in a region where the second conductive layer overlaps the first conductive layer when viewed in the first direction, the first portion extending in the first direction and intersecting with the first conductive layer, and the second portion intersecting with the second conductive layer; a first insulating member arranged between the first conductive layer and the second conductive layer in a region where the second conductive layer does not overlap the first conductive layer when viewed in the first direction; and a second insulating member extending in the first direction and intersecting with the first conductive layer in a region where the second insulating member overlaps the first insulating member when viewed in the first direction.

An upper end of the second insulating member is separated from a lower end of the first insulating member.

The embodiments will be described with reference to the drawings. The dimensions and scales used in the drawings are not binding upon actual products.

The description will use the same reference signs for the elements or components having the same or substantially the same functions and structures. If elements having the same structures need to be distinguished from each other, the description may add different characters or numerals after their respective reference signs.

1. Configuration

1.1 Memory System

FIG. 1 is a block diagram for explaining a configuration of a memory system according to an embodiment. This memory system is a storage device adapted for connection with an external host device (not illustrated). Examples for the memory system include a memory card such as an SD™ card. The memory system may instead be a universal flash storage (UFS), a solid state drive (SSD), or the like. A memory system 1 includes a memory controller 2 and a memory device 3.

The memory controller 2 is configured as, for example, an integrated circuit such as a system-on-a-chip (SoC). In response to a command from the host device, the memory controller 2 controls the memory device 3. In particular, the memory controller 2 may write data designated to be written by the host device into the memory device 3. The memory controller 2 may also read, from the memory device 3, data designated to be read by the host device and send it to the host device.

The memory device 3 is a memory that stores data in a non-volatile manner. The memory device 3 is, for example, a NAND flash memory.

Communications between the memory controller 2 and the memory device 3 comply, for example, with a single data rate (SDR) interface, a toggle double data rate (DDR) interface, an open NAND flash interface (ONFI), etc.

1.2 Memory Device

Referring to the block diagram of FIG. 1, the internal configuration of the memory device according to the embodiment will be described. The memory device 3 includes, for example, a memory cell array 10, a command register 11, an address register 12, a sequencer 13, a driver module 14, a row decoder module 15, and a sense amplifier module 16.

The memory cell array 10 includes a plurality of blocks BLK0 to BLKn (where n is an integer not less than 1). Each block BLK is a set of memory cells capable of storing data in a non-volatile manner, and may be used as a minimal erasable unit in a data erase operation. The memory cell array 10 is provided with multiple bit lines and multiple word lines. Each memory cell may be associated with one bit line and one word line. A more detailed description of the configuration of the memory cell array 10 will be given later.

The command register 11 is adapted to store a command CMD received by the memory device 3 from the memory controller 2. Examples of the command CMD include commands to cause the sequencer 13 to conduct read, write, and erase operations, etc.

The address register 12 stores address information ADD received by the memory device 3 from the memory controller 2. The address information ADD contains, for example, a block address BAd, a page address PAd, and a column address CAd. The block address BAd, the page address PAd, and the column address CAd are used for selection of a block BLK, a word line, and a bit line, respectively.

The sequencer 13 takes total control over the operations of the memory device 3. For instance, the sequencer 13 controls the driver module 14, the row decoder module 15, the sense amplifier module 16, and the like based on a command CMD stored in the command register 11 to perform read, write, and erase operations, and the like.

The driver module 14 generates a voltage for use in each of the read, write, and erase operations, and the like. In accordance with, for example, the page address PAd stored in the address register 12, the driver module 14 applies the generated voltage to a signal line corresponding to a selected word line.

The row decoder module 15 refers to the block address BAd stored in the address register 12 to select a corresponding one of the blocks BLK in the memory cell array 10. Then, the row decoder module 15 may transfer the voltage that has been applied to a signal line corresponding to the selected word line, to this selected word line in the selected block BLK.

In a write operation, the sense amplifier module 16 applies a given voltage to each bit line in accordance with the write data DAT received from the memory controller 2. In a read operation, the sense amplifier module 16 determines the data stored in a memory cell based on the voltage of the bit line and transfers the result of determination to the memory controller 2 as read data DAT.

1.3 Circuit Configuration of Memory Cell Array

FIG. 2 is a circuit diagram showing an exemplary circuit configuration of a memory cell array in the memory device according to the embodiment. FIG. 2 shows one of the blocks BLK included in the memory cell array 10. As shown in FIG. 2, the block BLK may include five string units SU0 to SU4.

Each string unit SU includes multiple NAND strings NS associated with respective bit lines BL0 to BLm (where m is an integer not less than 1). The NAND strings NS each include, for example, memory cell transistors MT0 to MT7 and select transistors ST1 and ST2. The memory cell transistors MT each include a control gate and a charge storage film, and store data in a non-volatile manner. The select transistors ST1 and ST2 are each used for selection of a string unit SU in various operations.

In each NAND string NS, the memory cell transistors MT0 to MT7 are coupled in series. The select transistor ST1 has its drain coupled to an associated bit line BL, and its source coupled to one end of the serially coupled memory cell transistors MT0 to MT7. The select transistor ST2 has its drain coupled to the other end of the serially coupled memory cell transistors MT0 to MT7, and its source coupled to a source line SL.

The memory cell transistors MT0 to MT7 each provided in multiple numbers within the same block BLK have their control gates coupled to respective word lines WL0 to WL7. The multiple select transistors ST1 in the string units SU0 to SU4 have their gates coupled to the corresponding one of the select gate lines SGD0 to SGD4. The multiple select transistors ST2 have their gates coupled to a select gate line SGS.

The bit lines BL0 to BLm have respective column addresses differing from one another. Each bit line BL is shared by the NAND strings NS having the same column address, over the multiple blocks BLK. The word lines WL0 to WL7 as a group are provided for every block BLK. The source line SL may be shared by the multiple blocks BLK.

A set of multiple memory cell transistors MT coupled to the common word line WL within one string unit SU may be called a "cell unit CU". The storage capacity of a cell unit CU constituted by the memory cell transistors MT each adapted to store 1-bit data is defined as "1-page data". Each cell unit CU may have a storage capacity of 2-page data or more, depending on the number of bits of data to be stored in the memory cell transistors MT.

The circuit configuration of the memory cell array 10 included in the memory device 3 according to the embodiment is not limited to the one described above. For instance, the number of string units SU in each block BLK may be set as needed. The number of memory cell transistors MT and the number of select transistors ST1 and ST2 in each NAND string NS may also be set as needed.

1.4 Structure of Memory Cell Array

An exemplary structure of a memory cell array of the memory device according to the embodiment will be described below. In the drawings mentioned below, a X direction corresponds to an extending direction of word lines WL. A Y direction corresponds to an extending direction of bit lines BL. A X-Y plane corresponds to a surface of a semiconductor substrate 20, which is used for formation of the memory device 3. A Z direction corresponds to a direction perpendicular to the X-Y plane. Plan views use hatching as appropriate for the sake of a better view. This hatching in the plan views is not necessarily related to materials or properties of the hatched components. Sectional views may omit components as appropriate for the sake of a better view.

1.4.1 Overview of Planar Layout

FIG. 3 is a plan view showing an exemplary planar layout of a memory cell array in the memory device according to the embodiment. The illustration of FIG. 3 covers an area corresponding to four blocks BLK0 to BLK3. As shown in FIG. 3, the memory cell array 10 may be divided into a memory area MA and hookup areas HA1 and HA2 in the X direction of the planar layout. The memory cell array 10 further includes multiple members SLT and SHE.

The memory area MA is arranged between the hookup areas HA1 and HA2. The memory area MA includes multiple NAND strings NS. The hookup areas HA1 and HA2 are each used for connections between the row decoder module 15 and the stacked interconnects (e.g., the word lines WL0 to WL7 and the select gate lines SGD and SGS).

The multiple members SLT each extend in the X direction and are aligned in the Y direction. Each member SLT is provided in the boundary region between any two adjacent blocks BLK in such a manner as to traverse the memory area MA and the hookup areas HA1 and HA2 in the X direction. Each member SLT may have a structure in which an insulator and a plate-like contact are embedded. Also, each member SLT is provided in such a manner as to split the stacked interconnects that are arranged next to each other with this member SLT interposed.

The multiple members SHE each extend in the X direction and are aligned in the Y direction. In the present example, four members SHE are provided between any two adjacent members SLT. Each member SHE traverses the memory area MA in the X direction. Here, the ends of each member SHE are respectively included in the hookup areas HA1 and HA2. Each member SHE has a structure in which an insulator is embedded. Also, each member SHE is provided in such a manner as to split the select gate lines SGD that are arranged next to each other with this member SHE interposed.

According to the planar layout of the memory cell array 10 described above, each region delimited by the members SLT corresponds to one block BLK. Further, each region delimited by the members SLT and SHE corresponds to one string unit SU. The memory cell array 10 repeats the layout as shown in FIG. 3 in the Y direction.

The memory cell array 10 included in the memory device 3 according to the embodiment is not limited to the planar layout described above. For instance, the number of members SHE provided between any two adjacent members SLT may be set as needed. The number of string units SU formed between any two adjacent members SLT may be changed in accordance with the number of members SHE provided between these members SLT.

1.4.2 Memory Area (Planar Layout)

FIG. 4 is a plan view showing a detailed exemplary planar layout of the memory area MA of a memory device according to the embodiment. The illustration of FIG. 4 covers one block BLK (i.e., string units SU0 to SU4) and two members SLT sandwiching the block BLK. As shown in FIG. 4, the memory cell array 10 in the memory area MA includes multiple memory pillars MP, multiple contacts CV, and multiple bit lines BL. Each member SLT includes a contact LI and spacers SP.

The memory pillars MP each function, for example, as an individual NAND string NS. These multiple memory pillars MP are arranged, for example, in a staggered manner in twenty-four rows in a region between two adjacent members SLT. Furthermore, the memory pillars MP, for example, in the fifth, tenth, fifteenth, and twentieth rows from the top of the drawing sheet each overlap with the respective one of the members SHE.

The multiple bit lines BL each extend in the Y direction, and are aligned in the X direction. Each bit line BL overlaps with at least one pillar MP for every string unit SU. In the example shown in FIG. 4, two bit lines BL together overlap with one memory pillar MP. In the structure where multiple bit lines BL together overlap with one memory pillar MP, one of such bit lines BL and the corresponding memory pillar MP are electrically connected to each other by way of the respective contact CV.

Between the bit lines BL and a memory pillar MP that contacts the member SHE, for instance, there may be no contact CV. In other words, a contact CV between a bit line BL and a memory pillar MP that is in contact with two different select gate lines SGD is omitted. The numbers or layout of memory pillars MP and members SHE arranged between the adjacent members SLT are not limited to the structure described with reference to FIG. 4, but may be modified as needed. The number of bit lines BL overlapping with each memory pillar MP may be set as needed.

The contact LI is a conductor extending along the X-Z plane. The spacers SP are insulators provided on the side surfaces of the contact LI. That is, the contact LI is held between spacers SP in a plan view.

(Sectional Structure)

FIG. 5 is a sectional view taken along the line V-V indicated in FIG. 4 and shows an exemplary sectional structure of the memory area MA of the memory device according to the embodiment. As shown in FIG. 5, the memory cell array 10 further includes a semiconductor substrate conductive layers 21 to 26, and insulating layers 30 to 37.

The semiconductor substrate 20 may be a P-type semiconductor. An insulating layer 30 is provided on an upper surface of this semiconductor substrate 20. The semiconductor substrate 20 and insulating layer 30 each include a circuit that is not illustrated. The circuits included in the semiconductor substrate 20 and insulating layer 30 correspond, for example, to the row decoder module and sense amplifier module 16. A conductive layer 21 is provided on an upper surface of the insulating layer 30.

The conductive layer 21 may be a plate-shaped conductor extending along the X-Y plane. The conductive layer 21 serves as a source line SL. The conductive layer 21 may contain silicon doped with phosphorous.

An insulating layer 31 and a conductive layer 22 are stacked in this order on an upper surface of the conductive layer 21. The conductive layer 22 is formed, for example, in a plate shape extending along the X-Y plane. The conductive layer 22 serves as a select gate line SGS. The conductive layer 22 contains, for example, tungsten. The insulating layer 31 contains, for example, silicon oxide.

Insulating layers 32 and conductive layers 23 are alternately stacked in this order on an upper surface of the conductive layer 22. Each conductive layer 23 may be formed in a plate shape extending along the X-Y plane. These stacked conductive layers 23 serve as word lines WL0 to WL3, respectively in the order from a side of the semiconductor substrate 20. The conductive layers 23 may contain tungsten, and the insulating layer 32 may contain silicon oxide.

An insulating layer 33 is provided on an upper surface of the topmost conductive layer 23. The insulating layer 33 has a thickness larger than that of each insulating layer 32. The insulating layer 33 may contain silicon oxide.

Insulating layers 34 and conductive layers 24 are alternately stacked in this order on an upper surface of the insulating layer 33. Each conductive layer 24 may be formed in a plate shape extending along the X-Y plane. The stacked conductive layers 24 serve as word lines WL4 to WL7, respectively in the order from the side of the semiconductor substrate 20. The conductive layers 24 may contain tungsten, and the insulating layers 34 may contain silicon oxide.

An insulating layer 35, a conductive layer 25, and an insulating layer 36 are stacked in this order on an upper surface of the topmost conductive layer 24. The conductive layer 25 may be formed in a plate shape extending along the X-Y plane. The conductive layer 25 serves as a select gate line SGD. The conductive layer 25 may contain tungsten, and the insulating layers 35 and 36 may contain silicon oxide.

A conductive layer 26 is provided on an upper surface of the insulating layers 36 with an insulating layer 37 interposed. The conductive layer 26 may be linearly formed to extend in the Y direction and serve as a bit line BL. That is, multiple conductive layers 26 are aligned in the X direction in an unillustrated region. The conductive layer 26 may contain copper. The insulating layer 37 covers an upper portion of the conductive layer 26. The insulating layer 37 may contain silicon oxide.

Each memory pillar MP includes a bottom portion BMP, a lower portion LMP, a junction portion JMP, and an upper portion UMP. The bottom portion BMP is arranged within the conductive layer 21. The lower portion LMP is connected to an upper end of the bottom portion BMP and extends in the Z direction while intersecting the conductive layers 22 and 23. The junction portion JMP is connected to an upper end of the lower portion LMP and is provided within the insulating layer 33. The upper portion UMP is connected to an upper end of the junction portion JMP and extends in the Z direction while intersecting the conductive layers 24 and 25. An upper end of the upper portion UMP is flush with the upper surface of the insulating layer 36.

A X-Y sectional area of the bottom portion BMP cut along the X-Y plane is larger than a X-Y sectional area of the lower pillar LMP at its lower end. A X-Y sectional area of the junction portion JMP is larger than that of the lower portion LMP at its upper end and is also larger than that of the upper portion UMP at its lower end.

A side surface of the lower portion BMP is offset and thus is not flush with an extension of a side surface of the lower portion LMP. A side surface of the junction portion JMP is offset and thus is not flush with an extension of the side surface of the lower portion LMP and an extension of a side surface of the upper portion UMP. Such a displacement of the side surfaces is present not only in the cross-sectional Y-Z plane as shown in FIG. 5 but also in any cross-section that includes the Z direction.

The memory pillars MP may each include a core film 40, a semiconductor film 41, and a lamination film 42. The core film 40 extends in the Z direction. For example, an upper end of the core film 40 is positioned above the conductive layer 25, while a lower end of the core film 40 is positioned in the same layer as the conductive layer 21. The semiconductor film 41 covers the circumference of the core film 40. In the bottom portion BMP, a side surface of the semiconductor film 41 is in contact with the conductive layer 21. Except for the portion of the semiconductor film 41 in contact with the conductive layer 21, the lamination film 42 covers the side and bottom surfaces of the semiconductor film 41. The core film 40 may contain an insulator such as silicon oxide. The semiconductor film 41 may contain silicon.

A portion of the memory pillar MP intersecting the conductive layer 22 functions as a select transistor ST2. A portion of the memory pillar MP intersecting one conductive layer 23 or one conductive layer 24 functions as a memory cell transistor MT. A portion of the memory pillar MP intersecting the conductive layer 25 functions as a select transistor ST1.

A columnar-shaped contact CV is provided on an upper surface of the semiconductor film 41 disposed in the memory pillar MP. In the illustrated region, two memory pillars MP are present in each of the sectional regions delimited by the members SLT and SHE, with a contact CV corresponding to one of the two memory pillars MP. To the memory pillars MP of the memory area MA that are illustrated as not overlapping with the member SHE and not having a contact CV connected thereto, respective contacts CV are connected in an unillustrated region.

An upper surface of each contact CV is connected to one conductive layer 26, i.e., one bit line BL. One conductive layer 26 is connected to one contact CV in each of the regions delimited by the members SLT and SHE. As such, the conductive layer 26 is electrically connected to a memory pillar MP provided between the adjacent members SLT and SHE, and also to a memory pillar MP provided between two adjacent two members SHE.

The member SLT splits each of the conductive layers 22 to 25. The contact LI in the member SLT is provided along the spacers SP. An upper end of the contact LI is in a layer between the conductive layers 25 and 26. A lower end of the contact LI is in contact with the conductive layer 21. The spacer SP is disposed between the contact LI and the conductive layers 22 to 25. With this spacer SP, the contact LI is separated and insulated from the conductive layers 22 to 25.

The member SHE splits the conductive layer 25. An upper end of the member SHE is located in a layer between the conductive layers 25 and 26, while a lower end of the member SHE is located in a layer between the conductive layers 24 and 25. The member SHE may contain an insulator such as silicon oxide. The upper end of the member SHE may or may not be at the same level as an upper end of the member SLT. Further, the upper end of the member SHE may or may not be at the same level as an upper end of the memory pillar MP. The number of conductive layers 22 to 25 may be set as needed. For instance, more than one conductive layer may be provided, and in that case, the lower end of the member SHE will be located in a layer between the topmost conductive layer 24 and the lowermost conductive layer 25. The location of the lower end of the member SHE therefore becomes deeper as the number of the conductive layers 25 increases.

FIG. 6 is a sectional view taken along the line VI-VI indicated in FIG. 5, showing an exemplary sectional structure of a memory pillar in the memory device according to the embodiment. More specifically, the illustration of FIG. 6 is a sectional structure of a memory pillar MP at the level of a layer that is parallel to the X-Y plane and includes the conductive layer 23. As shown in FIG. 6, the lamination film 42 may include a tunnel insulation film 43, a charge storage film 44, and a block insulation film 45.

In the cross-section including the conductive layer 23, the core film 40 is provided at the central part of the memory pillar MP. The semiconductor film 41 surrounds a side surface of the core film 40. The tunnel insulation film 43 surrounds a side surface of the semiconductor film 41. The charge storage film 44 surrounds a side surface of the tunnel insulation film 43. The block insulation film 45 surrounds a side surface of the charge storage film 44. The conductive layer 23 surrounds a side surface of the block insulation film 45.

The semiconductor film 41 serves as a channel (current path) for the memory cell transistors MT0 to MT7 and the select transistors ST1 and ST2. The tunnel insulation film 43 and the block insulation film 45 both contain, for example, silicon oxide. The charge storage film 44 has a function of storing electric charges, and may contain silicon nitride. With these components, the memory pillars MP are each capable of functioning as a NAND string NS.

1.4.3 Hookup Area (Planar Layout)

In the memory device 3 according to the embodiment, a structure of an even-numbered block BLK in the hookup area HA1 is similar to a structure of an odd-numbered block BLK in the hookup area HA2. Furthermore, a structure of an even-numbered block BLK in the hookup area HA2 is similar to a structure of an odd-numbered block BLK in the hookup area HA1.

In particular, the block BLK0 in the hookup area HA2, for example, has a planar layout that can be obtained by reversing the structure of the block BLK1 in the hookup area HA1 in the X direction and in the Y direction. The block BLK1 in the hookup area HA2 has a planar layout that can be obtained by reversing the structure of the block BLK0 in the hookup area HA1 in the X direction and in the Y direction. Hereinafter, an even-numbered block BLK will be referred to as "BLKe", and an odd-numbered block BLK will be referred to as "BLKo".

FIG. 7 is a plan view showing a detailed exemplary planar layout of a hookup area of the memory device according to the embodiment. The illustration of FIG. 7 covers regions corresponding to the two neighboring blocks BLKe and BLKo in the hookup area HA1, as well as part of the nearby memory area MA. An explanation will be given of a planar layout of the blocks BLK in the hookup areas HA1 and HA2, with reference to the planar layout of the blocks BLKe and BLKo in the hookup area HA1 shown in FIG. 7.

As shown in FIG. 7, the select gate line SGS, the word lines WL0 to WL7, and the select gate lines SGD in the hookup area HA1 each include a portion (terrace portion) that does not overlap with the upper interconnect layers (conductive layers) of the stacked interconnects. In the hookup area HA1, the memory cell array 10 includes a plurality of contacts CC and a plurality of support pillars HR.

In the hookup area HA1, a portion that does not overlap with the upper interconnect layers has a shape that resembles steps, a terrace, a rimstone, or the like. In particular, a step is created respectively between the select gate line SGS and the word line WL0, between the word line WL0 and the word line WL1, . . . , between the word line WL6 and the word line WL7, and between the word line WL7 and the select gate line SGD. FIG. 7 shows an example where the end portions of the word lines WL0 to WL7 form a step in the Y direction and multiple steps in the X direction, together forming a double-row staircase.

In a region where the hookup area HA1 and the block BLKe overlap each other, multiple contacts CC are provided on the respective terrace portions of the select gate line SGS, the word lines WL0 to WL7, and the select gate lines SGD0 to SGD4. Meanwhile, in a region where the hookup area HA1 and the block BLKo overlap each other, multiple contacts CC for the stacked interconnects are omitted.

On the other hand, in an unillustrated region where the hookup area HA2 and the block BLKo overlap each other, multiple contacts CC are provided on the respective terrace portions of the select gate line SGS, the word lines WL0 to WL7, and the select gate lines SGD0 to SGD4. In an unillustrated region where the hookup area HA2 and the block BLKe overlap each other, multiple contacts CC for the stacked interconnects are omitted.

The select gate line SGS, the word lines WL0 to WL7, and the select gate lines SGD0 to SGD4 are electrically connected to the row decoder module 15 via the respective corresponding contacts CC. In other words, a voltage is applied to each of the select gate line SGS, the word lines WL0 to WL7, and the select gate lines SGD0 to SGD4 via the contact CC provided, for example, in either of the hookup area HA1 or the hookup area HA2. Alternatively, contacts CC may be connected to each interconnect layer in both the hookup area HA1 and the hookup area HA2. In such a structure, voltages are applied to, for example, a word line WL from both sides of the contacts CC in the hookup area HA1 and the contacts CC in the hookup area HA2.

In the hookup areas HA1 and HA2, multiple support pillars HR are arranged suitably in regions excluding where the members SLT and the contacts CC are provided.

(Sectional Structure)

FIG. 8 is a sectional view taken along the line VIII-VIII indicated in FIG. 7, showing an exemplary sectional structure of the hookup area and memory area of a memory cell array in the memory device according to the embodiment. For the sake of explanation, the structure below the conductive layer 21 is omitted from FIG. 8.

As shown in FIG. 8, multiple conductive layers 27 are provided in the hookup area HA1. An end portion of the conductive layer 22 serving as the select gate line SGS, end portions of the conductive layers 23 and 24 serving as the word lines WL, and an end portion of the conductive layer 25 serving as the select gate line SGD are formed into a staircase shape. An insulating layer 38 is provided on upper surfaces of the terrace portion of the conductive layers 22 and 23. An insulating layer 39 is provided on upper surfaces of the terrace portion of the conductive layers 24.

The contacts CC are provided on the respective terrace portions of the select gate line SGS, the word lines WL0 to WL7, and the select gate lines SGD. A conductive layer 27 is provided on each contact CC. Each of the conductive layers 27 is electrically connected to the row decoder module 15 and located, for example, at the same level as the conductive layer 26. Accordingly, each of the conductive layers 22 to 25 is electrically connected to the row decoder module 15 by way of the corresponding contact CC and conductive layer 27. Here, each of the conductive layers 22 to 25 may be electrically connected to the row decoder module 15 by way of a further intervening connection with one or more interconnect layers (not illustrated) provided at a level higher than the conductive layers 27.

Each of the support pillars HR has a structure in which an insulator is embedded. The support pillar HR includes a bottom portion BHR, a lower portion LHR, a junction portion JHR, and an upper portion UHR. The bottom portion BHR is arranged within the conductive layer 21. The lower portion LHR is connected to an upper end of the bottom portion BHR, extending in the Z direction from the insulating layer 31 to the insulating layer 33. The junction portion JHR is arranged within the insulating layer 33. The upper portion UHR is connected to an upper end of the junction portion JHR, extending in the Z direction from the insulating layer 33 to the insulating layer 36. Each support pillar HR may include a void VO in each of the bottom portion BHR, lower portion LHR, junction portion JHR, and upper portion UHR, and these voids VO are mutually separated.

A X-Y sectional area of the bottom portion BHR is larger than that of the lower portion LHR at its lower end. A X-Y sectional area of the junction portion JHR is larger than the X-Y sectional area of the lower portion LHR at its upper end and also larger than a X-Y sectional area of the upper portion UHR at its lower end.

The bottom portion BHR has a side surface that is offset and thus is not flush with an extension from a side surface of the lower portion LHR. The junction portion JHR has a side surface that is offset and thus is not flush with an extension from the side surface of the lower portion LHR and an extension from a side surface of the upper portion UHR. Such a displacement of the side surfaces is present not only in the cross-section along the X-Z plane as shown in FIG. 8 but also in any cross-section that includes the Z direction.

The support pillars HR are divided into three types, namely support pillars HRa, HRb, and HRc, in accordance with their positions. A support pillar HRa is provided at a position overlapping with the conductive layer 25, when viewed from the Z direction. A support pillar HRb is provided at a position overlapping with the terrace portion of any conductive layer 24 or the terrace portion of the topmost conductive layer 23, when viewed from the Z direction. A support pillar HRc is provided at a position overlapping with the terrace portion of any conductive layer 23 except for the topmost conductive layer 23 when viewed from the Z direction. If the support pillars HRa, HRb, and HRc do not need to be distinguished from each other, they will be simply referred to as "support pillars HR".

The lower portion LHR of the support pillar HRa extends in the Z direction, intersecting the conductive layers 22 and 23. The junction portion JHR of the support pillar HRa is connected to the upper end of the lower portion LHR of the support pillar HRa. The upper portion UHR of the support pillar HRa extends in the Z direction, intersecting the conductive layers 24 and 25. The upper end of the upper portion UHR of the support pillar HRa is flush with the upper surface of the insulating layer 36.

The lower portion LHR of any support pillar HRb extends in the Z direction, intersecting the conductive layers 22 and 23. The junction portion JHR of the support pillar HRb is connected to the upper end of the lower portion LHR of the support pillar HRb. The upper portion UHR of the support pillar HRb extends in the Z direction up to the bottom surface of the conductive layer 24 or 25 immediately above the corresponding terrace portion. This means that the upper portion UHR of the support pillar HRb will not intersect the conductive layer 24 or 25 above the corresponding terrace portion.

The lower portion LHR of a support pillar HRc extends in the Z direction up to the bottom surface of the conductive layer 23 immediately above the corresponding terrace portion. This means that the lower portion LHR of the support pillar HRc will not intersect any conductive layers 23 above the corresponding terrace portion. The junction portion JHR of the support pillar HRc is separated from the upper end of the lower portion LHR of this support pillar HRc. The upper portion UHR of the support pillar HRc extends in the Z direction to the bottom surface of the lowermost conductive layer 25. This means that the upper portion UHR of the support pillar HRc will not intersect the conductive layer 24 or 25.

2. Method for Manufacturing Memory Device

FIGS. 9 to 24 each show an exemplary planar layout or an exemplary sectional structure at a certain step of manufacturing the memory device according to the embodiment. The illustrated sectional structures correspond to FIG. 8. An example of a process for manufacturing a memory cell array 10 of the memory device 3 will be described below.

First, as shown in FIG. 9, an insulating layer 30 is formed on the upper surface of the semiconductor substrate 20. A semiconductor layer 51, an insulating layer 52, a sacrificial layer 53, an insulating layer 54, and a semiconductor layer 55 are sequentially stacked on the upper surface of the insulating layer 30. The semiconductor layers 51 and 55 may contain polysilicon. The insulating layer 52 and 54 may contain silicon oxide. The sacrificial layer 53 may contain amorphous silicon. Thereafter, a mask with openings at positions corresponding the bottom portions BMP of the memory pillars MP and the bottom portions BHR of the support pillars HR is formed, for example, through photolithography. Using this mask, multiple holes H0 and H1 are formed through anisotropic etching in such a manner as to penetrate, for example, through the semiconductor layer 55, insulating layer 54, sacrificial layer 53, and insulating layer 52. The holes H0 and H1 respectively correspond to the bottom portions BMP of the memory pillars MP and the bottom portions BHR of the support pillars HR. At the bottom portions of the holes H0 and H1, the semiconductor layer 51 is partially exposed. For the anisotropic etching, reactive ion etching (RIE) may be adopted.

Next, as illustrated in FIG. 10, a sacrificial layer 56 is embedded inside the holes H0 and H1. The sacrificial layer 56 may contain carbon. The upper surface of the stacked structure may be planarized through chemical mechanical polishing (CMP). Thereafter, an insulating layer 31 and a sacrificial layer 57 are stacked in this order on the upper surfaces of the semiconductor layer 55 and sacrificial layer 56. Insulating layers 32 and sacrificial layers 58 are alternately stacked in this order on the upper surface of the sacrificial layer 57. An insulating layer 33 is formed on the upper surface of the topmost sacrificial layer 58. The sacrificial layers 57 and 58 may contain silicon nitride.

Next, as illustrated in FIG. 11, a mask with openings in the portions corresponding to the lower portions LMP of the memory pillars MP and the lower portions LHR of the support pillars HR is formed through photolithography or the like. Using this mask, multiple holes H2 and H3 are formed through anisotropic etching in such a manner as to penetrate, for example, the insulating layers 31, 32, and 33, and the sacrificial layers 57 and 58. The holes H2 and H3 respectively correspond to the lower portions LMP of the memory pillars MP and the lower portions LHR of the support pillars HR. At the bottom portions of the holes H2 and H3, the sacrificial layer 56 is partially exposed. In the anisotropic etching, the sacrificial layer 56 serves as a stopper having an etching rate lower than that of the insulating layers 31, 32, and 33, and the sacrificial layers 57 and 58. For the anisotropic etching, RIE may be adopted.

Thereafter, as illustrated in FIG. 12, the sacrificial layer 56 is removed through the holes H2 and H3. The holes H2 are covered with a resist layer 59. The holes H3 are embedded with an insulating layer 60. The insulating layer 60 may contain silicon oxide. Voids VO are formed inside the insulating layer 60 in such a manner as to be separated from each other in the portions corresponding to the bottom portions BHR and the portions corresponding to the lower portions LHR. After embedding the holes H3 with the insulating layer 60, the resist layer 59 is removed.

Figure 13:
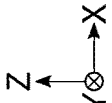
FIG. 13 is a cross-sectional view showing an exemplary cross-sectional structure of the memory device at one step of the manufacturing process according to the embodiment.
Figure 13:
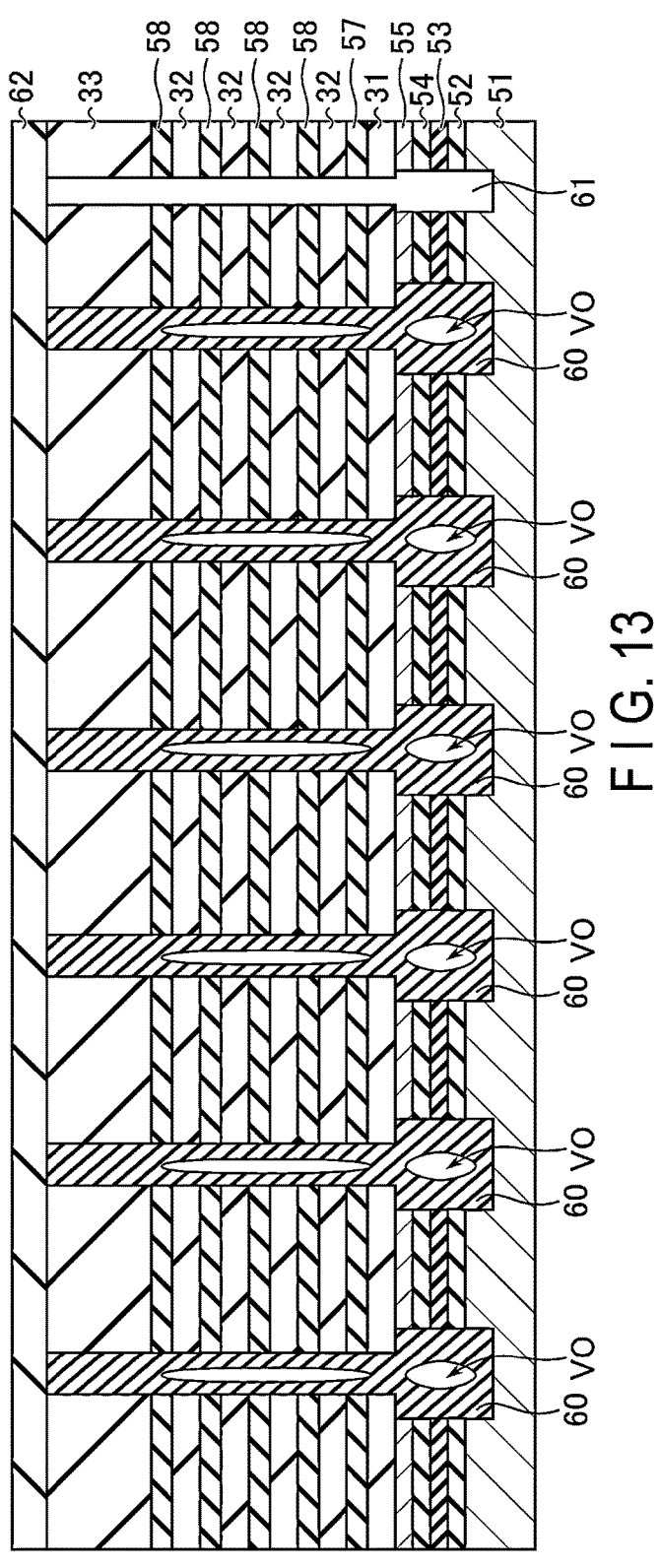

Next, as illustrated in FIG. 13, the holes H2 are embedded with a sacrificial layer 61. The sacrificial layer 61 may contain carbon. The upper surface of the stacked structure may be planarized through CMP. Thereafter, an insulating layer 62 is formed on the upper surfaces of the insulating layers 33 and 60, and the sacrificial layer 61. The insulating layer 62 may contain silicon oxide.

Then, as illustrated in FIG. 14, the end portions of the stacked sacrificial layers 57 and 58 are processed into a staircase shape in the hookup areas HA1 and HA2. At this processing step, the insulating layer 60 corresponding to the support pillars HRc is processed to remove its upper portions above the terrace portions. Thereafter, the stepped portions in the hookup areas HA1 and HA2 are embedded with an insulating layer 38. The upper surface of the stacked structure may be planarized through CMP.

Next, as illustrated in FIG. 15, a mask with openings in its portions corresponding to the junction portions JHR of the support pillars HR is formed through photolithography or the like. Using this mask, multiple holes H4 are formed through anisotropic etching in such a manner as to penetrate, for example, the insulating layer 62. The holes H4 correspond to the junction portions JHR of the support pillars HR. At the bottom portions of the holes H4 corresponding to the support pillars HRa and HRb, the insulating layer 60 is partially exposed. At the bottom portions of the holes H4 corresponding to the support pillar HRc, the insulating layer 38 is partially exposed. For the anisotropic etching, RIE may be adopted.

Next, as illustrated in FIG. 16, the insulating layer 62 is etched back so that the sacrificial layer 61 is exposed. Thereafter, the exposed sacrificial layer 61 is partially etched back so that multiple holes H5 are formed. The holes H5 correspond to the junction portions JMP of the memory pillars MP. Then, the holes H4 and H5 are expanded through wet etching or the like. As a result of this, the diameter of each of the holes H4 and H5 is increased. The bottom portions of the holes H5 formed after the wet etching may be positioned above the sacrificial layers 58 in a manner similar to the bottom portions of the holes H4.

As illustrated in FIG. 17, the holes H4 and H5 are embedded with a sacrificial layer 63. The sacrificial layer 63 may contain carbon. The upper surface of the stacked structure is planarized through CMP.

As illustrated in FIG. 18, insulating layers 34 and sacrificial layers 64 are alternately stacked in this order on the upper surfaces of the insulating layers 33 and 38 and the sacrificial layer 63. An insulating layer 35 and a sacrificial layer 65 are stacked on the upper surface of the topmost sacrificial layer 64. An insulating layer 36 is formed on the upper surface of the sacrificial layer 65. The sacrificial layers 64 and 65 may contain silicon nitride.

Figure 19:
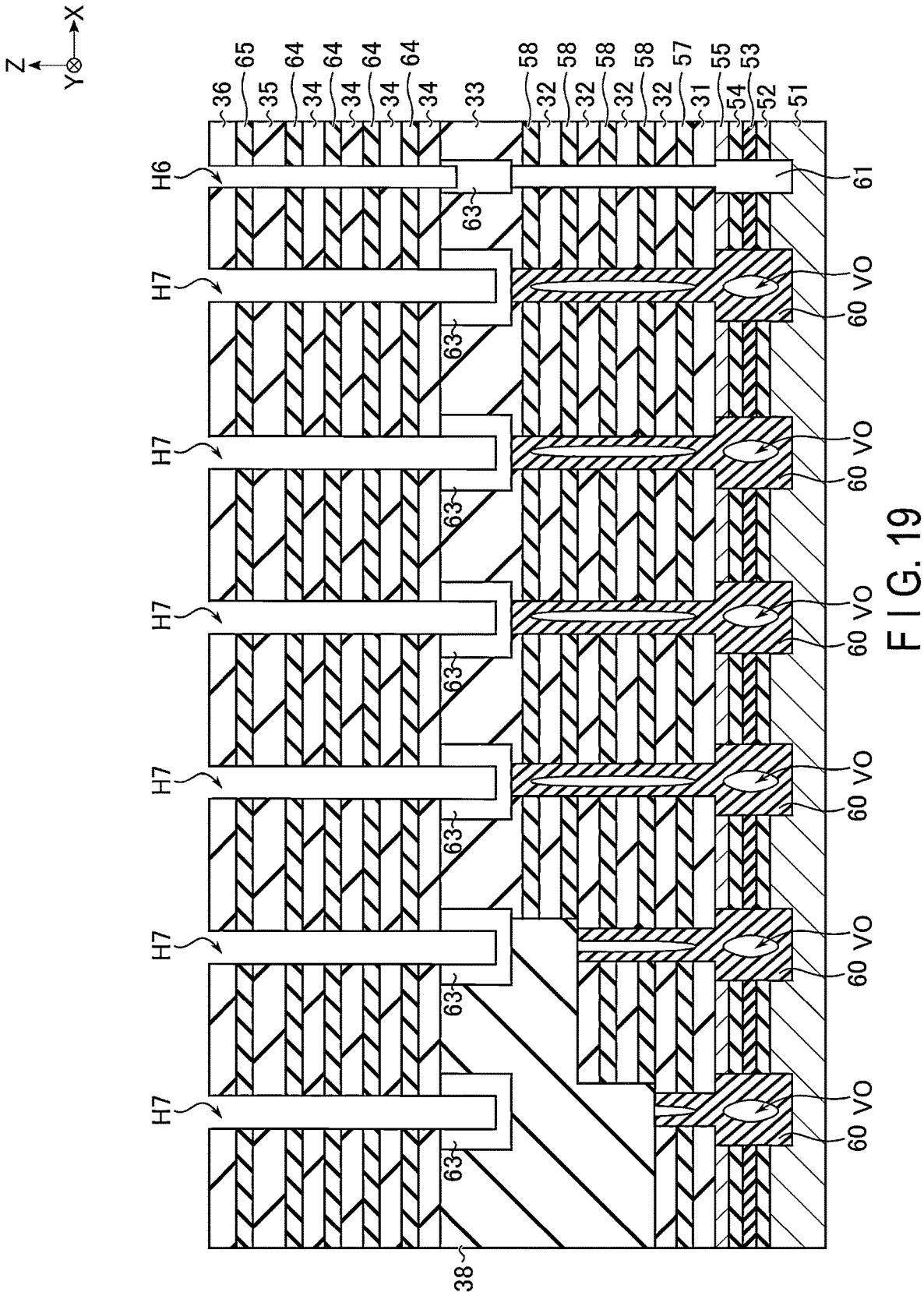
FIG. 19 is a cross-sectional view showing an exemplary cross-sectional structure of the memory device at one step of the manufacturing process according to the embodiment.

Next, as illustrated in FIG. 19, a mask with openings in its portions corresponding to the upper portions UMP of the memory pillars MP and the upper portions UHR of the support pillars HR is formed through photolithography or the like. Using this mask, holes H6 and H7 are formed through anisotropic etching in such a manner as to penetrate the insulating layers 34, 35, and 36, and the sacrificial layers 64 and 65. The holes H6 and H7 respectively correspond to the upper portions UMP of the memory pillars MP and the upper portions UHR of the support pillars HR. The sacrificial layer 63 is partially exposed at the bottom portions of the holes H6 and H7. In the anisotropic etching, the sacrificial layer 63 serves as a stopper having an etching rate lower than that of the insulating layers 34, 35, and 36 and of the sacrificial layers 64 and 65. For the anisotropic etching, RIE may be adopted.

Figure 20:
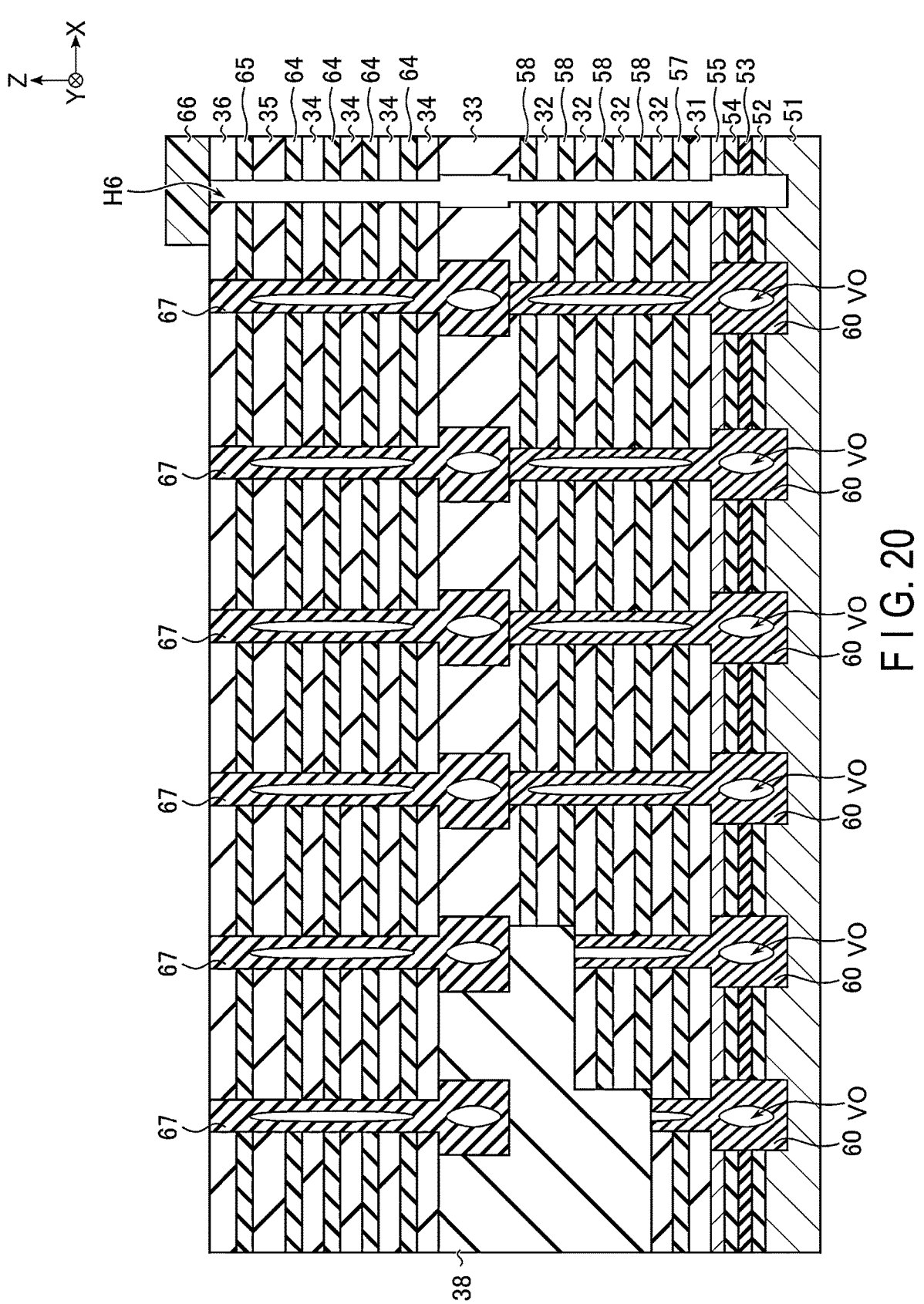
FIG. 20 is a cross-sectional view showing an exemplary cross-sectional structure of the memory device at one step of the manufacturing process according to the embodiment.

As illustrated in FIG. 20, the sacrificial layer 63 is removed through the holes H7, at the same time as the sacrificial layers 61 and 63 being removed through the holes H6. The holes H6 are covered with the resist layer 66. The holes H7 are embedded with the insulating layer 67. The insulating layer 67 may contain silicon oxide. Voids VO are formed inside the insulating layer 67 in its portions corresponding to the junction portions JHR and the upper portions UHR in such a manner as to be separated from each other. After the holes H7 are embedded with the insulating layer 67, the resist layer 66 is removed.

Figure 21:
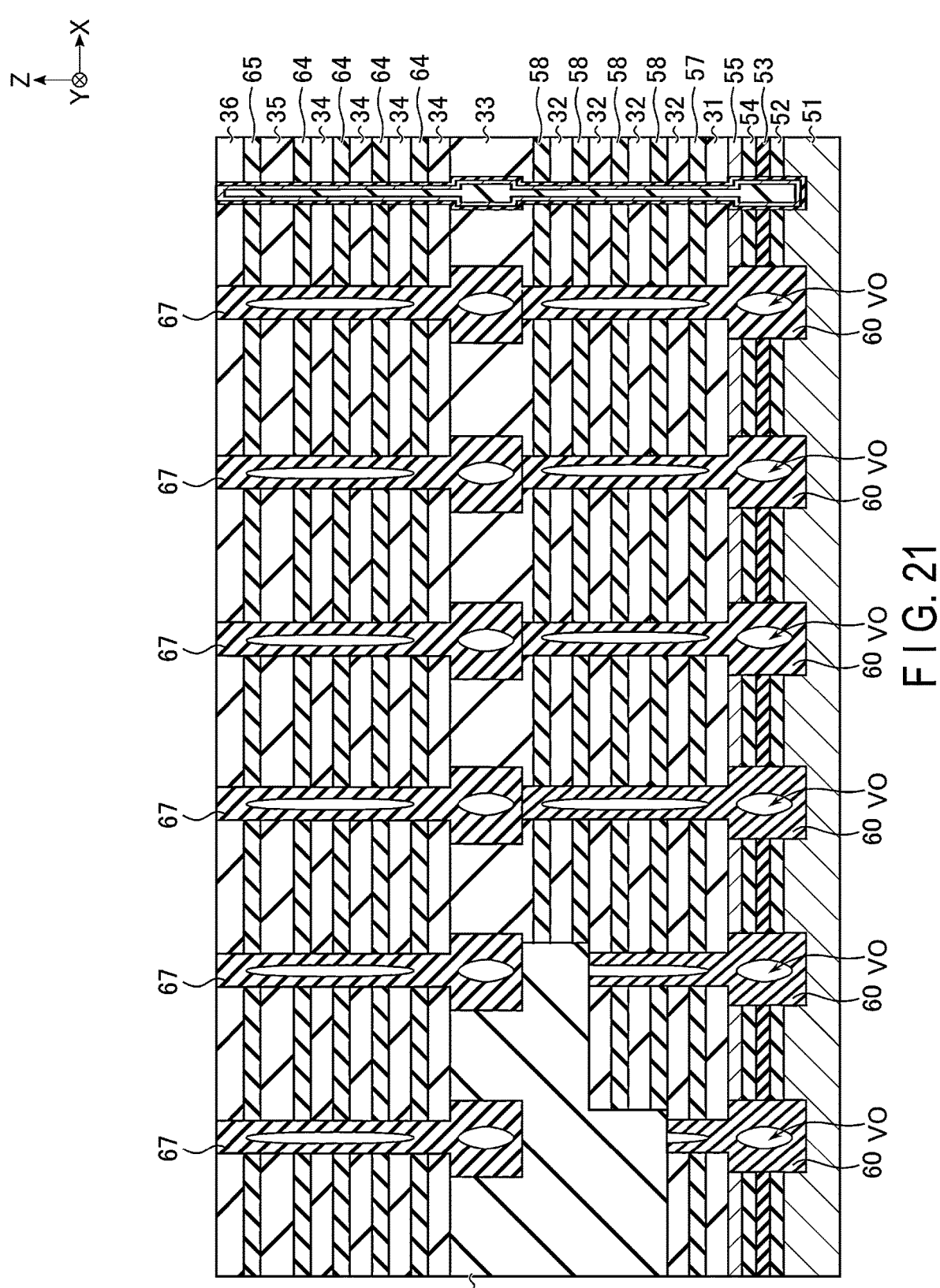
FIG. 21 is a cross-sectional view showing an exemplary cross-sectional structure of the memory device at one step of the manufacturing process according to the embodiment.

As illustrated in FIG. 21, a block insulation film 45, a charge storage film 44, a tunnel insulation film 43, a semiconductor film 41, and a core film 40 are formed in this order within the holes H6. The holes H6 are embedded with the core film 40. Then, the core film 40 above the holes H6 is partially removed, and a semiconductor film 41 is formed in these portions. The upper surface of the stacked structure may be planarized through CMP.

Figure 22:
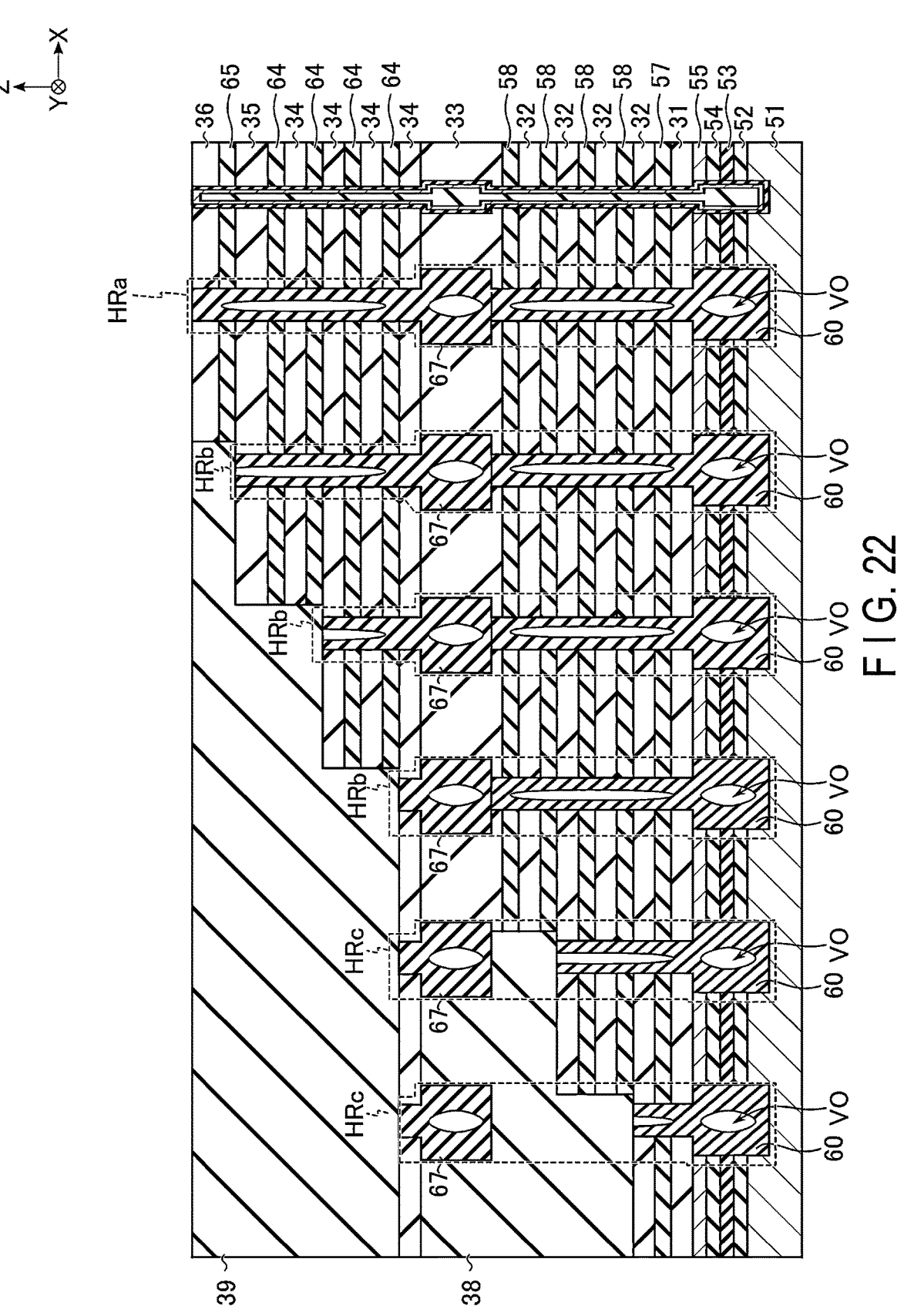
FIG. 22 is a cross-sectional view showing an exemplary cross-sectional structure of the memory device at one step of the manufacturing process according to the embodiment.

Next, as illustrated in FIG. 22, the end portions of the stacked sacrificial layers 64 and 65 are processed into a staircase shape in the hookup areas HA1 and HA2. At this processing step, the insulating layer 67 corresponding to the support pillars HRb and HRc is processed to remove its portions above the terrace portion. Thereafter, the stepped portions in the hookup areas HA1 and HA2 are embedded with an insulating layer 39. After the upper surface of the stacked structure is planarized through CMP or the like, an insulating layer 37 is formed on the stacked structure. As a result, support pillars HRa, HRb, and HRc are formed.

Figure 23:
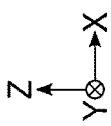
FIG. 23 is a cross-sectional view showing an exemplary cross-sectional structure of the memory device at one step of the manufacturing process according to the embodiment.

Next, as illustrated in FIG. 23, a replacement process is conducted. In this replacement process, the replacement with the source lines SL and the replacement with the select gate lines SGS and SGD and word lines WL0 to WL7 are sequentially conducted.

For the replacement with the source lines SL, first, a mask with openings in its portions corresponding to the members SLT is formed through photolithography or the like. Using this mask, slits (not shown) are formed through the anisotropic etching to penetrate the insulating layers 31 to 37 and the sacrificial layers 57, 58, 64 and 65. The sacrificial layer 53 is selectively removed via these slits through wet etching or the like. Thereafter, the insulating layers 52 and 54 and part of the lamination film 42 are selectively removed via the slits through wet etching or the like. A semiconductor layer (such as silicon) is embedded in the space created in the sacrificial layer 53 and the insulating layers 52 and 54. With this semiconductor layer and the semiconductor layers 51 and 55, the conductive layer 21 is formed, which will serve as source lines SL. The conductive layer 21, which is in contact with the side surface of the semiconductor film 41, is electrically connected to the semiconductor film 41. In this manner, a memory pillar MP is completed.

In the replacement with the word lines WL0 to WL7, the sacrificial layers 57, 58, 64, and 65 are selectively removed via the slits through wet etching with thermal phosphoric acids or the like. A conductor is embedded via the slits in the space created after the removal of the sacrificial layers 57, 58, 64, and 65. For the formation of the conductor in this process, chemical vapor deposition (CVD) may be adopted. Thereafter, an etch-back process is conducted to remove the conductor formed in the slits. As a result, the conductor formed through these slits is separated into multiple conductive layers. Thus, a conductive layer 22, which will serve as a select gate line SGS, conductive layers 23, which will respectively serve as word lines WL0 to WL3, conductive layers 24, which will respectively serve as word lines WL4 to WL7, and a conductive layer 25, which will serve as a select gate line SGD, are formed. The conductive layers 22, 23, 24, and 25 formed in this process may contain a barrier metal. In that case, in the formation of the conductor after the removal of the sacrificial layers 57, 58, 64, and 65, a titanium nitride film may be formed as a barrier metal, and then a tungsten film may be formed.

Then, as illustrated in FIG. 24, a mask with openings in its portions corresponding to the contacts CC is formed through photolithography. Using this mask, holes H8 are formed through anisotropic etching in such a manner as to penetrate the insulating layers 32 to 39. The holes H8 correspond to the contacts CC. The conductive layers 22 to 25 are partially exposed at the bottom portions of the respective holes H8. For the anisotropic etching, RIE may be adopted. Thereafter, the holes H8 are embedded with a conductor to form contacts CC.

With the aforementioned manufacturing process, a memory cell array 10 is produced. The manufacturing process is only an example and does not pose a limitation. For instance, other processing steps may be inserted in the course of the manufacturing process, or some of the processing steps may be omitted or integrated together. Furthermore, wherever possible, the order of the processing steps may be interchanged.

3. Effects of Embodiment

According to the embodiment, a support pillar HRc includes a junction portion JHR having an X-Y sectional area larger than that of an upper portion UHR. The hole H4 corresponding to the junction portion JHR is embedded with a sacrificial layer 63. As a material for the sacrificial layer 63, carbon is selected so as to lower the etching rate in comparison with the insulating layer 34, 35, and 36 and the sacrificial layers 64 and 65 in the formation of the holes H7 corresponding to the upper portions UHR. This can prevent the holes H7 from extending below the sacrificial layer 63 in the formation of the holes H7. The junction portion JHR and lower portion LHR of each support pillar HRc thereby can be prevented from being connected to each other in the terrace portion of the conductive layers 21 and 22. Thus, sufficient margins of the contacts CC can be ensured with respect to the support pillars HR in the terrace portion of the conductive layers 21 and 22. This effect will be described with reference to FIGS. 25 and 26.

FIG. 25 is a plan view showing an exemplary margin of a contact in the memory device according to the embodiment. FIG. 26 is a plan view showing an exemplary margin of a contact in a memory device according to a comparative example. In the example of FIG. 25, a junction portion JHR is provided between the upper portion UHR and lower portion LHR of a support pillar HR, whereas in the example of FIG. 26, no junction portion JHR is provided between the upper portion UHR and lower portion LHR of a support pillar HR. FIGS. 25 and 26 show the positional relationship of the lower portion LHR and upper portion UHR of the support pillar HR and a hole H9 corresponding to a contact CC in the terrace portion of the conductive layers 21 and 22. In both (A) of FIG. 25 and (A) of FIG. 26, a small displacement is illustrated between the lower portion LHR and upper portion UHR in each support pillar HR. In both (B) of FIG. 25 and (B) of FIG. 26, a large displacement is illustrated between the lower portion LHR and upper portion UHR in each support pillar HR.

As illustrated in (A) and (B) of FIG. 26, the hole H9 according to the comparative example reaches the terrace portion of the conductive layers 21 and 22. If there is a large displacement between the lower portion LHR and upper portion UHR in each support pillar HR, the margin CM' of the contact CC relative to the support pillar HR becomes smaller than the margin CM. If the hole H9 relative to the contact CC comes into contact with a support pillar HR on the upper surface of the terrace portion of the conductive layers 21 and 22, the hole H9 may reach a conductive layer below the conductive layers 21 and 22 by way of the support pillar HR. Thus, in the comparative example, the possibility of multiple word lines WL becoming short-circuited via a contact CC is unfavorably increased.

In contrast, as illustrated in (A) and (B) of FIG. 25, the sacrificial layer 63 according to the present embodiment prevents the hole H9 from reaching the terrace portion of the conductive layers 21 and 22. Thus, regardless of the presence or absence of displacement of the lower portion LHR and upper portion UHR in the support pillars HR, the margin CM of a contact CC relative to the support pillars HR is unchanged. This prevents an increase in the probability that the hole H9 corresponding to a contact CC will come into contact with a support pillar HR on the upper surface of the terrace portion of the conductive layers 21 and 22. Thus, according to the present embodiment, the possibility of word lines WL becoming short-circuited via a contact CC can be reduced, improving a yield of a memory device 3.

4. Modifications

According to the above embodiment, the junction portion JHR and upper portion UHR remaining in the support pillar HRc have been described, which is not a limitation. For instance, the junction portion JHR and upper portion UHR do not always need to be formed for a support pillar HRc.

Figure 27:
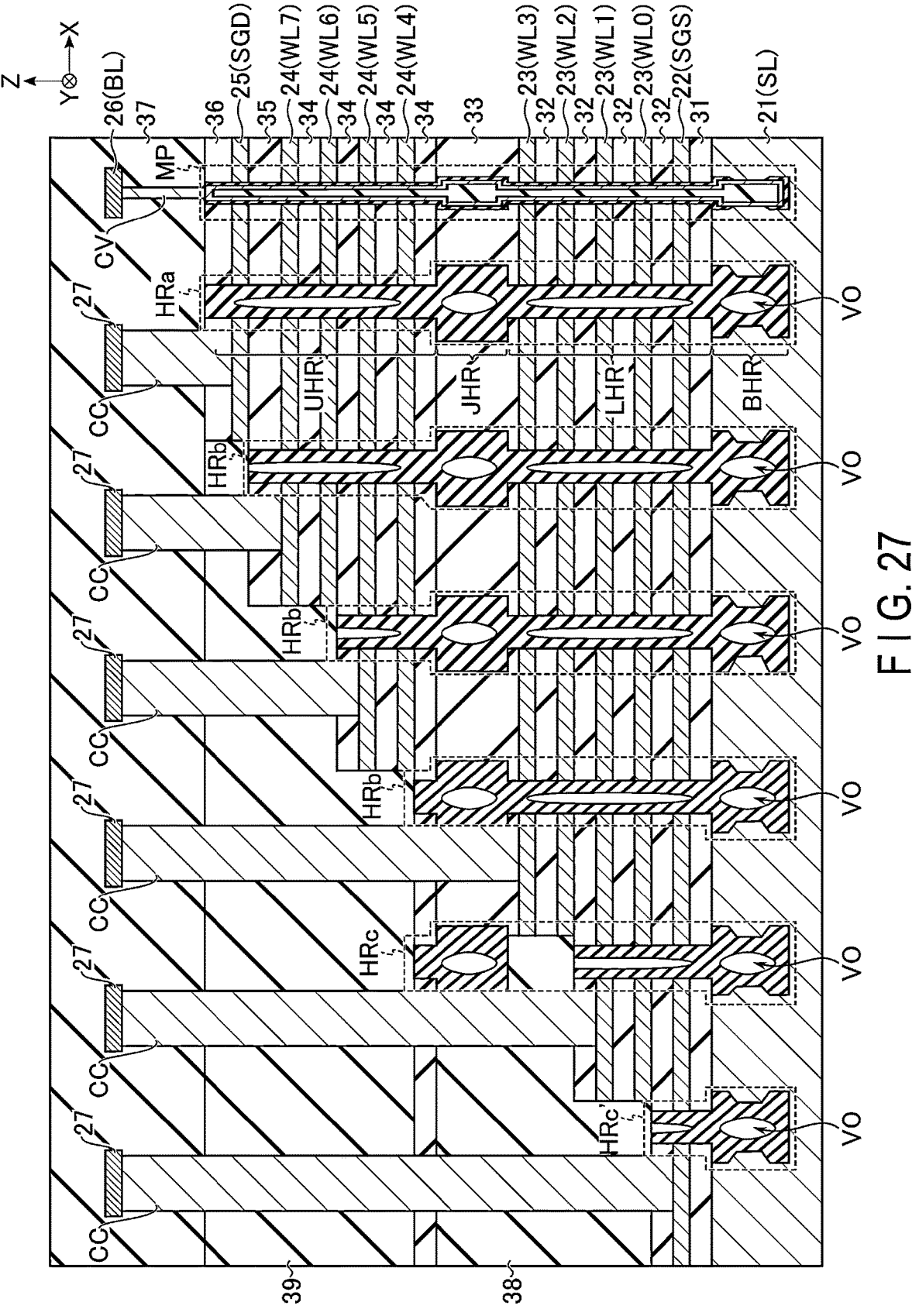
FIG. 27 is a sectional view of an exemplary cross-sectional structure of a hookup area of the memory device according to a modification.

FIG. 27 is a sectional view of an exemplary cross-sectional structure of a hookup area of the memory device according to a modification. FIG. 27 corresponds to the structure of FIG. 8 according to the embodiment.

As illustrated in FIG. 27, among the support pillars HR aligned in the X direction, a support pillar HRc', which is located multiple (two, for example) support pillars HR away from the support pillar HRb having an upper portion UHR penetrating the conductive layers 24, does not need to have a junction portion JHR and an upper portion UHR. Even if the support pillar HRc' is provided with a junction portion JHR and an upper portion UHR, these junction portion JHR and upper portion UHR do not have a function of supporting the stacked structure during the replacement with the conductive layers 22 to 25.

Among the support pillars HR aligned in the X direction, multiple (two, for example) support pillars HRc, which are neighboring to the support pillar HRb having an upper portion UHR penetrating the conductive layers 24, remain in a form with a junction portion JHR and an upper portion UHR. This is because a support pillar HR located at the end of the simultaneously processed support pillars HR tends to have a low processability, as a result of which dimensional and geometrical requirements for support pillars HR may not be satisfied. Thus, multiple (e.g., two) support pillars HRc neighboring support pillars HRb that respectively have an upper portion UHR penetrating the conductive layers 24 may be kept as end-portion support pillars HR so that the processability of the upper portions UHR of the support pillars HRb that function to support the stacked structure during the replacement process will be prevented from being deteriorated.

In the above embodiment, formation of voids VO in the support pillars HR has been described as an example, which is not a limitation. For instance, support pillars HR may be formed so as to have no void VO inside.

Furthermore, in the above embodiment, an exemplary structure of a member SLT including a contact LI has been described, which is not a limitation. For instance, the member SLT may be formed to include no contact LI and to be embedded with an insulator.

In the embodiments, a structure of a memory device 3 mounted on a chip has been described, which is not a limitation. For instance, the memory device 3 may have a structure in which a chip having a sense amplifier module 16 and the like mounted thereon and another chip having a memory cell array 10 mounted thereon are adhered to each other.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The embodiments and their modifications are covered by the accompanying claims and their equivalents, as would fall within the scope and gist of the inventions.

What is claimed is:

1. A memory device comprising:
   a first conductive layer and a second conductive layer arranged apart from each other and aligned in a first direction;
   a memory pillar including a first portion serving as a first memory cell and a second portion serving as a second memory cell in a region where the second conductive layer overlaps the first conductive layer when viewed in the first direction, the first portion extending in the first direction and intersecting with the first conductive layer, and the second portion intersecting with the second conductive layer;
   a first insulating member arranged between the first conductive layer and the second conductive layer in a region where the second conductive layer does not overlap the first conductive layer when viewed in the first direction;
   a second insulating member extending in the first direction and intersecting with the first conductive layer in a region where the second insulating member overlaps the first insulating member when viewed in the first direction,
   a third insulating member arranged between the first conductive layer and the second conductive layer in the region where the second conductive layer overlaps the first conductive layer when viewed in the first direction; and
   a fourth insulating member extending in the first direction and intersecting with the first conductive layer in a region where the fourth insulating member overlaps the third insulating member when viewed in the first direction, wherein
   an upper end of the second insulating member is separated from a lower end of the first insulating member, and
   an upper end of the fourth insulating member is coupled to a lower end of the third insulating member.

2. The memory device according to claim 1, further comprising:
   a fifth insulating member extending in the first direction and intersecting with the second conductive layer in a region where the fifth insulating member overlaps the third insulating member when viewed in the first direction,
   wherein a lower end of the fifth insulating member is coupled to an upper end of the third insulating member.

3. The memory device according to claim 2, wherein a sectional area of the third insulating member along a first plane intersecting with the first direction is larger than a sectional area of the fifth insulating member along the first plane.

4. The memory device according to claim 2, wherein the third insulating member has a third void inside, the fifth insulating member has a fifth void inside, and the fifth void is separated from the third void.

5. The memory device according to claim 2, wherein a side surface of the third insulating member and an extension of a side surface of the fifth insulating member are mutually displaced.

6. The memory device according to claim 1, wherein a sectional area of the first insulating member along a first plane intersecting with the first direction is larger than a sectional area of the second insulating member along the first plane.

7. The memory device according to claim 1, wherein a sectional area of the third insulating member along a first plane intersecting with the first direction is larger than a sectional area of the fourth insulating member along the first plane.

8. The memory device according to claim 1, wherein the third insulating member has a third void inside, the fourth insulating member has a fourth void inside, and the fourth void is separated from the third void.

9. The memory device according to claim 1, wherein a side surface of the first insulating member and an extension of a side surface of the second insulating member are mutually displaced.

10. The memory device according to claim 1, wherein a side surface of the third insulating member and an extension of a side surface of the fourth insulating member are mutually displaced.

11. A memory device comprising:

a first conductive layer and a second conductive layer arranged apart from each other and aligned in a first direction;

a memory pillar including a first portion serving as a first memory cell and a second portion serving as a second memory cell in a region where the second conductive layer overlaps the first conductive layer when viewed in the first direction, the first portion extending in the first direction and intersecting with the first conductive layer, and the second portion intersecting with the second conductive layer;

a first insulating member arranged between the first conductive layer and the second conductive layer in a region where the second conductive layer does not overlap the first conductive layer when viewed in the first direction; and a second insulating member extending in the first direction and intersecting with the first conductive layer in a region where the second insulating member overlaps the first insulating member when viewed in the first direction, wherein an upper end of the second insulating member is separated from a lower end of the first insulating member, the first insulating member has a first void inside, the second insulating member has a second void inside, and the second void is separated from the first void.

12. A memory device comprising:

a first conductive layer and a second conductive layer arranged apart from each other and aligned in a first direction;

a memory pillar including a first portion serving as a first memory cell and a second portion serving as a second memory cell in a region where the second conductive layer overlaps the first conductive layer when viewed in the first direction, the first portion extending in the first direction and intersecting with the first conductive layer, and the second portion intersecting with the second conductive layer;

a first insulating member arranged between the first conductive layer and the second conductive layer in a region where the second conductive layer does not overlap the first conductive layer when viewed in the first direction; and a second insulating member extending in the first direction and intersecting with the first conductive layer in a region where the second insulating member overlaps the first insulating member when viewed in the first direction, wherein an upper end of the second insulating member is separated from a lower end of the first insulating member, the memory pillar further includes a third portion configured to mutually couple the first portion and the second portion, a sectional area of the third portion along a first plane intersecting with the first direction is larger than a sectional area of the first portion along the first plane, and the sectional area of the third portion along the first plane is larger than a sectional area of the second portion along the first plane.

13. The memory device according to claim 12, wherein a side surface of the third portion and an extension of a side surface of the first portion are mutually displaced, and the side surface of the third portion and an extension of a side surface of the second portion are mutually displaced.

14. A memory device comprising:

a first conductive layer and a second conductive layer arranged apart from each other and aligned in a first direction;

a memory pillar including a first portion serving as a first memory cell and a second portion serving as a second memory cell in a region where the second conductive layer overlaps the first conductive layer when viewed in the first direction, the first portion extending in the first direction and intersecting with the first conductive layer, and the second portion intersecting with the second conductive layer;

a first insulating member arranged between the first conductive layer and the second conductive layer in a region where the second conductive layer does not overlap the first conductive layer when viewed in the first direction; and a second insulating member extending in the first direction and intersecting with the first conductive layer in a region where the second insulating member overlaps the first insulating member when viewed in the first direction;

a third conductive layer aligned with and apart from the first conductive layer in the first direction on a side opposite the second conductive layer with respect to the first conductive layer, wherein an upper end of the second insulating member is separated from a lower end of the first insulating member, the memory pillar further includes a fourth portion that is in contact with the third conductive layer and that is coupled to the first portion, and a sectional area of the fourth portion along a first plane intersecting with the first direction is larger than a sectional area of the first portion along the first plane.

15. The memory device according to claim 14, further comprising:

a sixth insulating member that is in contact with the third conductive layer and that is coupled to the second insulating member, wherein a sectional area of the sixth insulating member along the first plane is larger than a sectional area of the second insulating member along the first plane.

16. A memory device comprising:

a first conductive layer and a second conductive layer arranged apart from each other and aligned in a first direction;

a memory pillar including a first portion serving as a first memory cell and a second portion serving as a second memory cell in a region where the second conductive layer overlaps the first conductive layer when viewed in the first direction, the first portion extending in the first direction and intersecting with the first conductive layer, and the second portion intersecting with the second conductive layer;

a first insulating member arranged between the first conductive layer and the second conductive layer in a region where the second conductive layer does not overlap the first conductive layer when viewed in the first direction; and a second insulating member extending in the first direction and intersecting with the first conductive layer in a region where the second insulating member overlaps the first insulating member when viewed in the first direction; and a contact that extends in the first direction, intersects with the second conductive layer, and is in contact with the first conductive layer in a region where the second conductive layer overlaps neither the first conductive layer nor the second insulating member when viewed in the first direction, wherein an upper end of the second insulating member is separated from a lower end of the first insulating member.

\* \* \* \* \*